US012684993B2

(12) United States Patent
Kwon et al.

(10) Patent No.: US 12,684,993 B2
(45) Date of Patent: Jul. 14, 2026

(54) DISPLAY DEVICE

(71) Applicant: LG Display Co., Ltd., Seoul (KR)

(72) Inventors: Hoiyong Kwon, Seoul (KR); JiHun Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 729 days.

(21) Appl. No.: 17/961,728

(22) Filed: Oct. 7, 2022

(65) Prior Publication Data

US 2023/0111215 A1 Apr. 13, 2023

(30) Foreign Application Priority Data

Oct. 8, 2021 (KR) ......................... 10-2021-0134344

(51) Int. Cl.
| | |
|---|---|
| *H10K 59/80* | (2023.01) |
| *H05K 5/02* | (2006.01) |
| *H10K 59/12* | (2023.01) |

(52) U.S. Cl.
CPC ......... H10K 59/871 (2023.02); H05K 5/0217 (2013.01); H10K 59/12 (2023.02)

(58) Field of Classification Search
None
See application file for complete search history.

(56) References Cited

U.S. PATENT DOCUMENTS

| | | | |
|---|---|---|---|
| 2011/0050657 A1* | 3/2011 | Yamada ................. | H10K 59/87 |
| | | | 361/679.01 |
| 2020/0203642 A1* | 6/2020 | Kim ........................ | H10K 59/87 |
| 2020/0212132 A1* | 7/2020 | Kim ..................... | H10K 59/124 |
| 2021/0074189 A1 | 3/2021 | Kwon et al. | |

FOREIGN PATENT DOCUMENTS

| | | |
|---|---|---|
| CN | 108598287 A | 9/2018 |
| CN | 112466206 A | 3/2021 |
| KR | 10-2019-0073850 A | 6/2019 |
| KR | 10-2020-0030265 A | 3/2020 |
| KR | 10-2021-0020726 A | 2/2021 |

* cited by examiner

*Primary Examiner* — Khaja Ahmad
(74) *Attorney, Agent, or Firm* — Birch, Stewart, Kolasch & Birch, LLP

(57) ABSTRACT

A display device can include a lower substrate made of a transparent conducting oxide or an oxide semiconductor, a first inorganic insulating layer disposed on the lower substrate, a planarization layer disposed on the first inorganic insulating layer, a light-emitting element disposed on the planarization layer, and a sealing substrate disposed on the first inorganic insulating layer, the planarization layer, and the light-emitting element. The display device can further include a back cover disposed on the sealing substrate and having a plurality of opening portions, and a roller part configured to wind or unwind the back cover. An end of the first inorganic insulating layer can be disposed inward from an end of the sealing substrate.

22 Claims, 14 Drawing Sheets

COLUMN
DIRECTION

ROW
DIRECTION

DISPLAY DEVICE

CROSS-REFERENCE TO RELATED APPLICATIONS

This application claims priority to Korean Patent Application No. 10-2021-0134344 filed in the Republic of Korea on Oct. 8, 2021, the entire contents of which are incorporated herein by reference into the present application.

BACKGROUND

Field

The present disclosure relates to a display device, and more particularly, to a rollable display device capable of displaying images even in a case in which the display device is rolled up.

Description of the Related Art

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, a flexible display device can be made by forming display elements, lines, and the like on a substrate, and the substrate can be made of a flexible plastic material having flexibility. Thus, the flexible display device can display images even by being folded or rolled up, and has attracted attention as the next-generation display device.

SUMMARY OF THE DISCLOSURE

An object to be achieved by the present disclosure is to provide a rollable display device that uses a substrate including a transparent conducting oxide layer or an oxide semiconductor layer instead of a plastic substrate.

Another object to be achieved by the present disclosure is to provide a rollable display device using a flexible substrate that minimizes cracks by mitigating stress occurring during rolling.

Still another object to be achieved by the present disclosure is to provide a display device capable of reducing an operation defect by inhibiting a back cover from being expanded.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device comprises a lower substrate made of a transparent conducting oxide or an oxide semiconductor, a first inorganic insulating layer disposed on the lower substrate, a planarization layer disposed on the first inorganic insulating layer, a light-emitting element disposed on the planarization layer, a sealing substrate disposed on the first inorganic insulating layer, the planarization layer, and the light-emitting element, a back cover disposed on the sealing substrate and having a plurality of opening portions; and a roller part configured to wind or unwind the back cover, wherein an end of the first inorganic insulating layer is disposed inward from an end of the sealing substrate.

According to another aspect of the present disclosure, there is provided a display device. The display device comprises a display panel comprising a functional thin-film layer, an inorganic insulating layer, a planarization layer, a light-emitting element, and a sealing substrate, the display panel being divided into a display area and a non-display area, a back cover disposed on a rear surface of the display panel, configured to support the display panel, and having a plurality of holes and a seal member disposed to surround a side surface of the display panel, wherein the functional thin-film layer is made of a transparent conducting oxide or an oxide semiconductor, and the inorganic insulating layer comprises a first inorganic insulating layer having an end disposed inward from an end of the sealing substrate.

Other detailed matters of the exemplary embodiments are included in the detailed description and the drawings.

According to the present disclosure, it is possible to improve flexibility of the display device by using the transparent conducting oxide layer or the thin-film oxide semiconductor layer as the substrate of the display device.

According to the present disclosure, it is possible to reduce an operation defect by suppressing the expansion of the back cover by adjusting the positions of the plurality of opening portions of the back cover.

According to the present disclosure, it is possible to suppress the occurrence of cracks by changing the arrangement position of the inorganic insulating layer in the outer peripheral region of the display panel.

According to the present disclosure, the inorganic insulating layer in the outer peripheral region of the display panel is disconnected, and the disconnected region is filled with the organic insulating layer. Therefore, it is possible to inhibit a crack, which can occur in the inorganic insulating layer disposed at the outer periphery, from propagating into the display panel.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
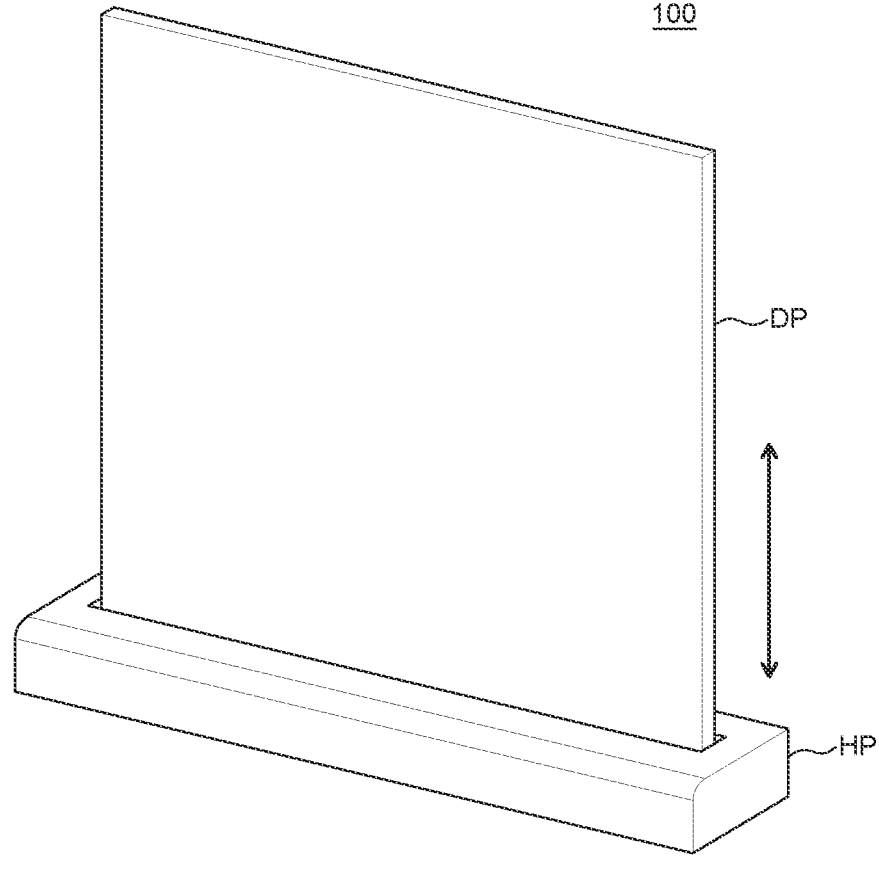
FIGS. 1 and 2 are perspective views of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components, and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings. All the components of each display device according to all embodiments of the present disclosure are operatively coupled and configured.

<Display Device—Rollable Display Device>

A rollable display device refers to a display device capable of displaying images even in a case in which the rollable display device is rolled up. The rollable display device can have higher flexibility than a general display device in the related art. A shape of the rollable display device can be freely changed depending on whether the rollable display device is used. Specifically, when the rollable display device is not used, the rollable display device can be rolled up and stored with a reduced volume. On the contrary, when the rollable display device is used, the rolled-up rollable display device can be unrolled again and used.

Figure 2:
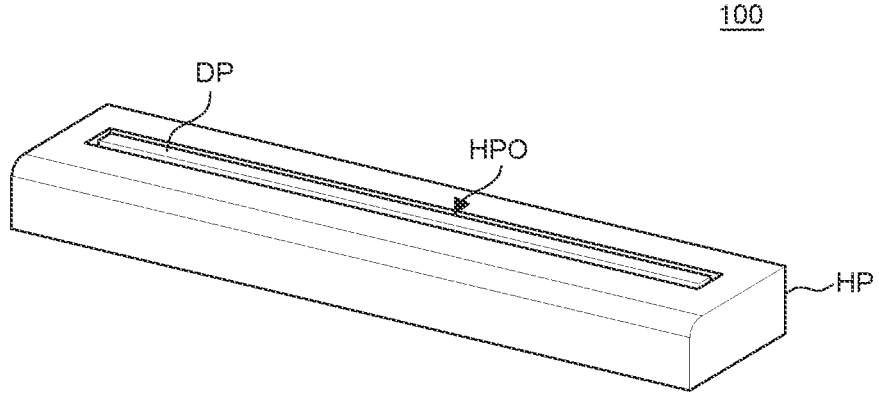
Figure 3:
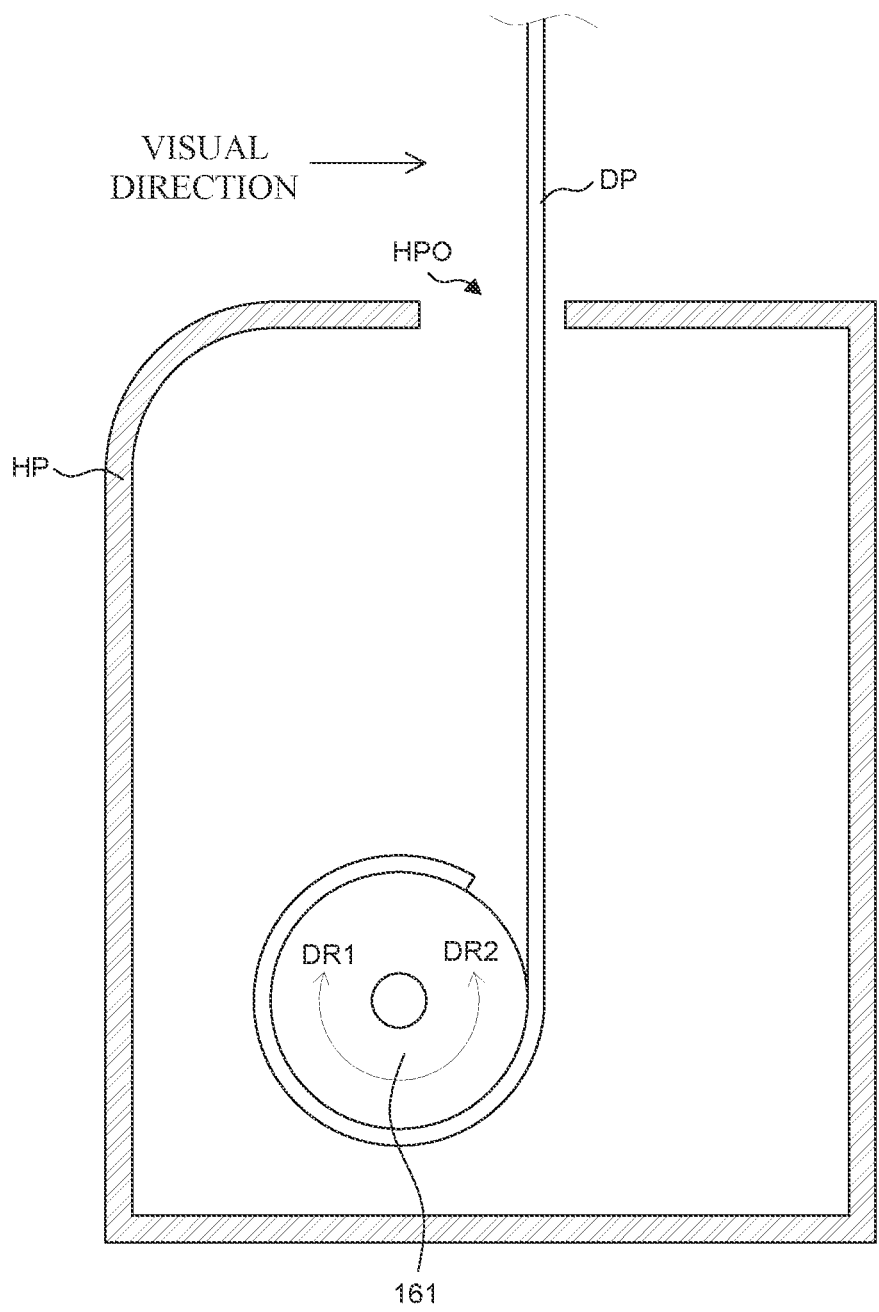
FIG. 3 is a schematic cross-sectional view of the display device according to the embodiment of the present disclosure.

FIGS. 1 and 2 are perspective views of a display device according to an embodiment of the present disclosure. FIG. 3 is a schematic cross-sectional view of the display device according to the embodiment of the present disclosure. More specifically, FIG. 3 is a schematic cross-sectional view for explaining a roller 161 and a display part DP of a display device 100 according to an embodiment of the present disclosure. For the convenience of description, FIG. 3 illustrates a housing part HP, the roller 161, and the display part DP.

Referring to FIGS. 1 and 2, the display device 100 according to the embodiment of the present disclosure includes the display part DP and the housing part HP.

The display part DP is configured to display images to a user. For example, display elements and circuits, lines, and components for operating the display elements can be disposed on the display part DP. In this case, because the display device 100 according to the embodiment of the present disclosure is a rollable display device, the display part DP can be configured to be wound or unwound. For example, the display part DP can include a display panel and a back cover having flexibility so as to be wound or unwound. The display part DP will be described below in more detail with reference to FIGS. 4 to 6.

The housing part HP is a casing capable of accommodating the display part DP. The housing part HP can have an opening portion HPO through which the display part DP can move to the outside or the inside of the housing part HP.

Meanwhile, the display part DP of the display device 100 can switch from a fully unwound state illustrated in FIG. 1A to a fully wound state illustrated in FIG. 1B or switch from the fully wound state to the fully unwound state.

A drive part is disposed to wind or unwind the display part DP to switch the display part DP to the fully unwound state or the fully wound state. The drive part can include a roller part and a lift part and use a motor, a link structure, and the like to wind the display part DP around the roller 161 or unwind the display part DP from the roller 161.

Specifically, referring to FIG. 3, the roller 161 can have a cylindrical shape as a whole. However, the present disclosure is not limited thereto. The roller 161 can have any shape as long as the display part DP can be wound around the roller 161.

Meanwhile, the display part DP can be connected to the roller 161. For example, the back cover, which will be described below among the components of the display part DP, can be fastened to the roller 161, such that the display part DP can be wound around the roller 161 or unwound from the roller 161 in accordance with the rotation of the roller 161. In this case, a surface of the display part DP on which images are displayed faces the roller 161 during a process in which the display part DP is wound around the roller 161. Therefore, in the display part DP, a visual direction can be a direction illustrated in FIG. 3.

To wind the display part DP, the roller 161 can rotate, and the display part DP can be wound around the roller 161. For example, referring to FIG. 3, when the roller 161 rotates in a first direction DR1, i.e., clockwise, the display part DP can be wound so that a rear surface of the display part DP in close contact with the surface of the roller 161.

To unwind the display part DP, the roller 161 can rotate, and the display part DP can be unwound from the roller 161. Referring to FIG. 3, for example, when the roller 161 rotates in a second direction DR2, i.e., counterclockwise, the display part DP wound around the roller 161 can be unwound from the roller 161 and disposed outside the housing part HP.

Figure 4:
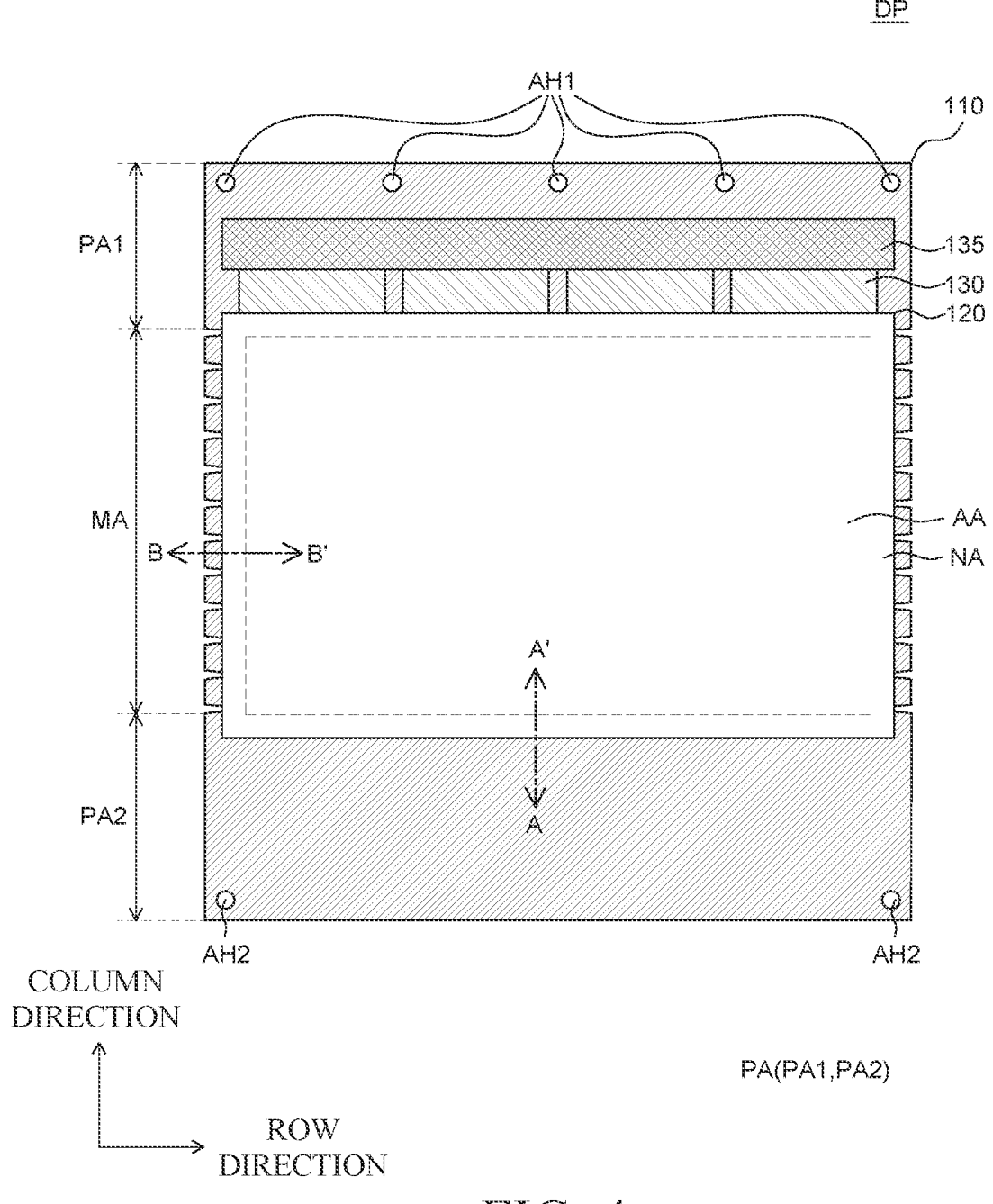
FIG. 4 is a top plan view of a display part of the display device according to the embodiment of the present disclosure.
Figure 5:
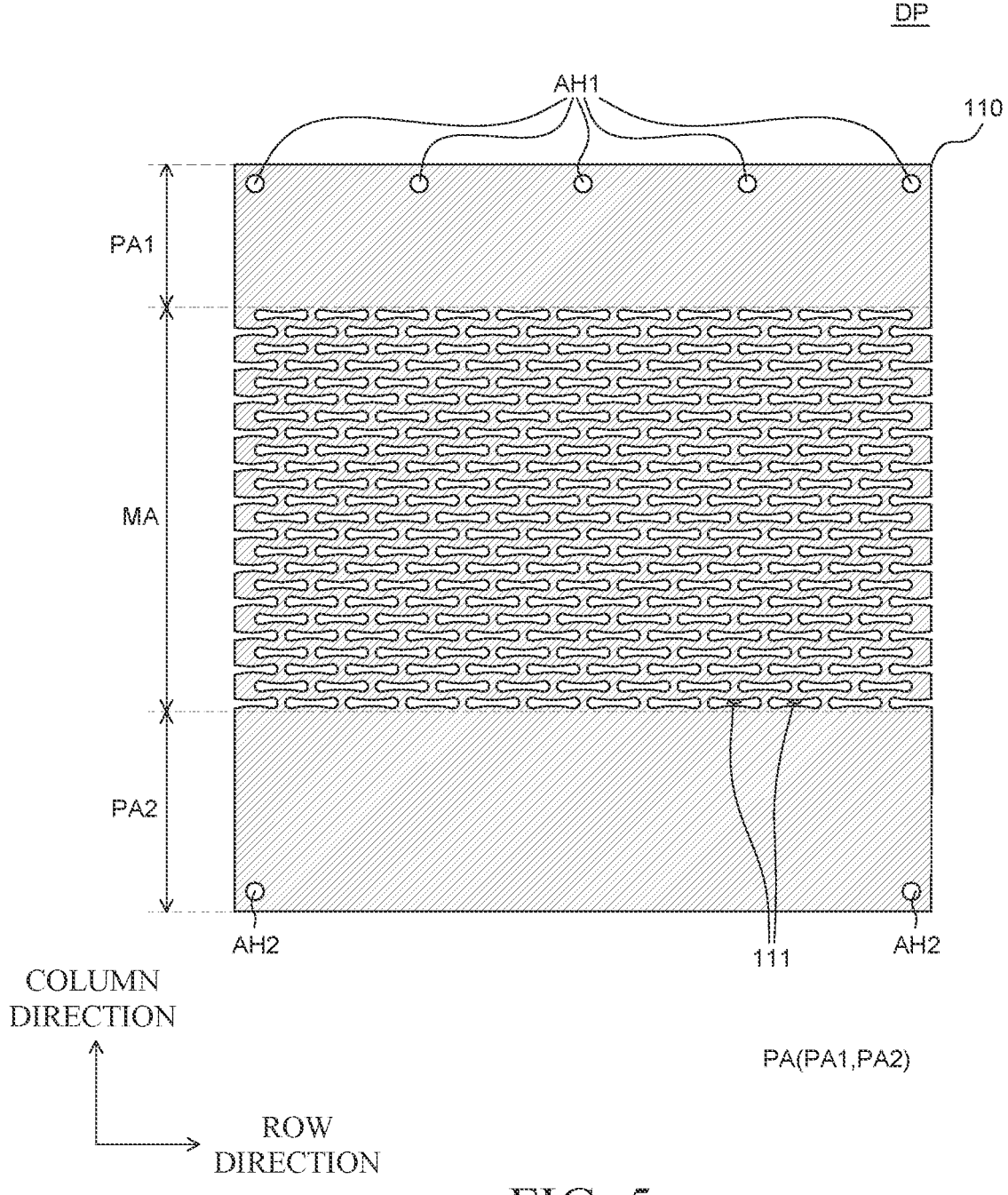
FIG. 5 is a top plan view of a back cover of the display device according to the embodiment of the present disclosure.

FIG. 4 is a top plan view of a display part of the display device according to the embodiment of the present disclosure. FIG. 5 is a top plan view of the back cover of the display device according to the embodiment of the present disclosure, and FIG. 6 is a cross-sectional view taken along line A-A' in FIG. 4.

Figure 6:
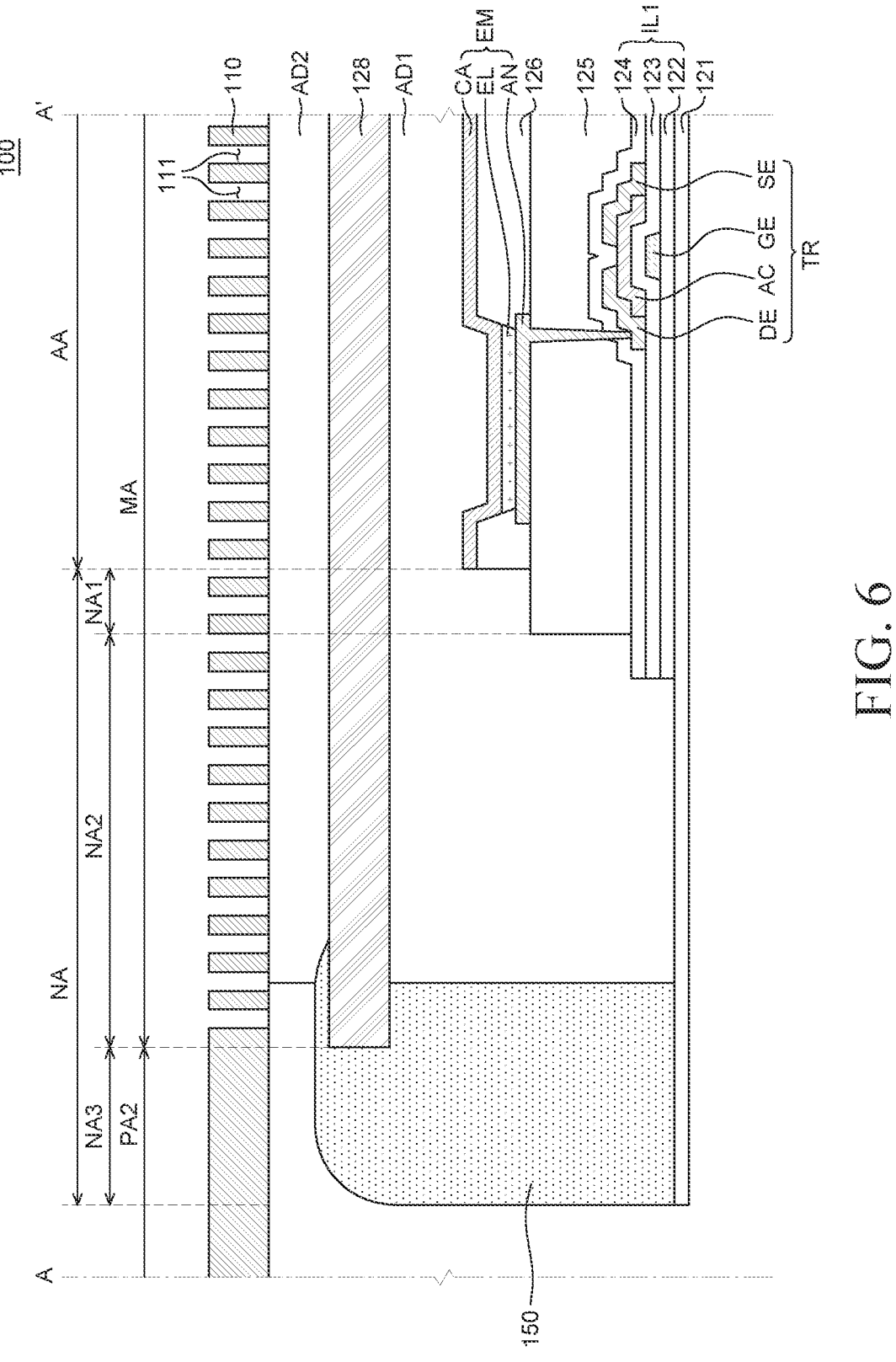
FIG. 6 is a cross-sectional view taken along line A-A' in FIG. 4.

Referring to FIGS. 4 to 6, the display part DP can include a back cover 110, a display panel 120, flexible films 130, and a printed circuit board 135.

The display panel 120 is a panel configured to display images to a user. The display panel 120 can include a display element configured to display images, a driving element configured to operate the display element, and lines configured to transmit various types of signals to the display element and the driving element.

The display elements can have different configurations depending on the type of display panel 120. For example, in a case in which the display panel 120 is an organic light-emitting display panel 120, the display element can be an organic light-emitting element including an anode, an organic light-emitting layer, and a cathode. For example, in a case in which the display panel 120 is a liquid crystal display panel 120, the display element can be a liquid crystal display element. Hereinafter, the assumption is made that the display panel 120 is the organic light-emitting display panel 120. However, the display panel 120 is not limited to the organic light-emitting display panel 120. In addition, because the display device 100 according to the embodiment of the present disclosure is a rollable display device, the display panel 120 can be implemented as a flexible display panel 120 so as to be wound around or unwound from the roller 161.

The display panel 120 according to the embodiment of the present disclosure includes a display area AA and a non-display area NA. For the convenience, the non-display area NA can be defined as an area except for the display area AA. The display area AA can be disposed at a central portion of the display panel 120. The display area AA can be an area of the flexible display device 100 in which images are displayed.

Various display elements and various driving elements for operating the display elements can be disposed in the display area AA. For example, the display element can be configured as a light-emitting element EM including an anode AN, an organic light-emitting layer EL, and a cathode CA. In addition, various driving elements such as a transistor TR, a capacitor, lines, and the like, which are configured to operate the display elements, can be disposed in the display area AA.

Meanwhile, the display panel 120 can be a top-emission type display panel or a bottom-emission type display panel depending on a direction in which light is emitted from the light-emitting element EM.

The top-emission type display panel allows the light emitted from the light-emitting element EM to propagate toward an upper side of a lower substrate 121 on which the light-emitting element EM is disposed. The top-emission type display panel can have a reflective layer formed on a lower portion of the anode AN in order to allow the light emitted from the light-emitting element EM to propagate toward the upper side of the lower substrate 121, i.e., toward the cathode CA.

The bottom-emission type display panel allows the light emitted from the light-emitting element EM to propagate toward a lower side of the lower substrate 121 on which the light-emitting element EM is disposed. In the case of the bottom-emission type display panel, the anode AN can be made of only a transparent electrically conductive material and the cathode CA can be made of a metallic material with high reflectance in order to allow the light emitted from the light-emitting element to propagate toward the lower side of the lower substrate 121.

Hereinafter, for the convenience of description, the display device 100 according to the embodiment of the present disclosure will be described as being the bottom-emission type display device 100. However, the present disclosure is not limited thereto.

The non-display area NA can be an area positioned at a rim of the display panel 120. The non-display area NA can be an area in which no image is displayed. The non-display area NA can be disposed to surround the display area AA. Various constituent elements for operating a plurality of subpixels disposed in the display area AA can be disposed in the non-display area NA. For example, drive ICs, drive circuits, signal lines, the flexible films 130, and the like, which are configured to supply signals for operating the plurality of subpixels, can be disposed.

As described above, the one or more flexible films 130 can be disposed in the non-display area NA. The one or more flexible films 130 each are a film having various types of components such as the drive IC disposed on a base film having ductility in order to supply signals to the plurality of subpixels and the drive circuit in the display area AA. The one or more flexible films 130 can be electrically connected to the display panel 120.

The one or more flexible films 130 are disposed at one end of the non-display area NA of the display panel 120 and can supply power voltages, data voltages, and the like to the plurality of subpixels and the drive circuit in the display area AA.

The drive ICs such as gate driver ICs and data driver ICs can be disposed on the one or more flexible films 130. The drive IC is a component configured to process data for displaying the image and process a driving signal for processing the data. The drive IC can be disposed in ways such as a chip-on-glass (COG) method, a chip-on-film (COF) method, and a tape carrier package (TCP) method depending on how the drive IC is mounted. However, for the convenience of description, the configuration has been described in which the drive ICs are mounted on the one or more flexible films 130 by the chip-on-film method. However, the present disclosure is not limited thereto.

The printed circuit board 135 can be disposed on a rear surface of the back cover 110 and connected to the one or more flexible films 130. The printed circuit board 135 is a component for supplying a signal to a drive IC. Various types of components for supplying the drive IC with various signals such as driving signals, data signals, and the like can be disposed on the printed circuit board 135.

Meanwhile, an additional printed circuit board connected to the printed circuit board 135 can be further disposed. For example, the printed circuit board 135 can be referred to as a source printed circuit board (source PCB (S-PCB)) on which a data drive part is mounted. The additional printed circuit board connected to the printed circuit board 135 can be referred to as a control printed circuit board (control PCB (C-PCB)) on which the timing controller and the like are mounted. For example, the additional printed circuit board can be disposed in the roller 161, disposed on the housing part HP outside the roller 161, or disposed to directly contact with the printed circuit board 135.

Referring to FIGS. 4 and 5, the back cover 110 can be disposed on the rear surface of the display panel 120 and support the display panel 120, the one or more flexible films 130, and the printed circuit board 135. A size of the back cover 110 can be larger than a size of the display panel 120. The back cover 110 can protect the other components of the display part DP from the outside.

The back cover 110 can be made of a material having rigidity. At least a part of the back cover 110 can have flexibility so as to be wound or unwound together with the display panel 120. For example, the back cover 110 can be made of a metallic material such as stainless steel (steel use stainless (SUS)) or Invar or a plastic material. However, the material of the back cover 110 can be variously changed in accordance with design as long as the material of the back cover 110 satisfies physical property conditions such as a thermal deformation amount, a radius of curvature, rigidity, and the like. However, the present disclosure is not limited thereto.

The back cover 110 includes a plurality of support areas PA and a ductile area MA. The plurality of support areas PA are areas in which a plurality of opening portions 111 are not disposed. The ductile area MA is an area in which the plurality of opening portions 111 are disposed. The ductile area MA can be referred to as a central area that overlaps the display panel 120. Specifically, a first support area PA1, the ductile area MA, and a second support area PA2 can be sequentially disposed from an uppermost end of the back cover 110. However, the present disclosure is not limited thereto. In this case, because the back cover 110 is wound or unwound in a column direction, the plurality of support areas PA and the ductile area MA can be disposed in the column direction.

The first support area PA1 is an uppermost end are of the back cover 110, i.e., an area fastened to a head bar. First fastening holes AH1 can be formed in the first support area PA1 so that the first support area PA1 is fastened to the head bar. For example, the first support area PA1 of the back cover 110 can be fastened to the head bar by means of screws that penetrate the head bar and the first fastening holes AH1. Further, because the first support area PA1 is fastened to the head bar, the back cover 110 can also move upward or downward when the head bar moves upward or downward, and the display panel 120 attached to the back cover 110 can also move upward or downward. FIG. 4 illustrates five first fastening holes AH1. However, the number of first fastening holes AH1 is not limited thereto. In addition, the configuration has been described with reference to FIG. 4, in which the back cover 110 is fastened to the head bar by using the first fastening holes AH1. However, the present disclosure is not limited thereto. The back cover 110 and the head bar can be fastened to each other without a separate fastening hole.

In addition, the one or more flexible films 130 and the printed circuit board 135 connected to one end of the display panel 120 can be disposed in the first support area PA1. The first support area PA1 can support the printed circuit board 135 to protect the printed circuit board 135 and allow the printed circuit board 135 to be kept flat without being curved when the roller 161 rotates.

The ductile area MA is an area extending from the first support area PA1 to the lower side of the back cover 110. The ductile area MA is an area in which the plurality of opening portions 111 can be disposed and to which the display panel 120 is attached. Specifically, the ductile area MA is an area that is wound around or unwound from the roller 161, together with the display panel 120. The ductile area MA can overlap at least the display panel 120 among the other components of the display part DP.

In addition, the second support area PA2 is an area extending from the ductile area MA toward the lower side of the back cover 110. The second support area PA2 is a lowermost end area of the back cover 110, i.e., an area fastened to the roller 161. Second fastening holes AH2 can be formed in the second support area PA2 so that the second support area PA2 is fastened to the roller 161. For example, screws are disposed to penetrate the roller 161 and the second fastening holes AH2, such that the roller 161 and the second support area PA2 of the back cover 110 can be fastened to each other. Further, as the second support area PA2 is fastened to the roller 161, the back cover 110 can be wound around or unwound from the roller 161. FIG. 4 illustrates two second fastening holes AH2. However, the number of second fastening holes AH2 is not limited thereto.

Meanwhile, the plurality of opening portions 111, which are formed in the ductile area MA, are not formed in the first support area PA1 and the second support area PA2. Specifically, the first fastening holes AH1 are formed in the first support area PA1, and the second fastening holes AH2 are formed in the second support area PA2. However, the plurality of opening portions 111 formed in the ductile area MA are not formed in the first support area PA1 and the second support area PA2. The first and second fastening holes AH1 and AH2 are different in shape from the plurality of opening portions 111. The first support area PA1 is an area fixed to the head bar, i.e., an area in which the one or more flexible films 130 and the printed circuit board 135 are supported. The second support area PA2 is an area fixed to the roller 161 and can have higher rigidity than the ductile area MA.

For example, FIG. 4 illustrates that the plurality of support areas PA and the ductile area MA of the back cover 110 are sequentially disposed in the column direction. However, in a case in which the back cover 110 is wound in a row direction, the plurality of support areas PA and the ductile area MA can be disposed in the row direction.

The plurality of opening portions 111 disposed in the ductile area MA of the back cover 110 can be deformed by stress applied to the display part DP while the display part DP is wound or unwound. Specifically, the ductile area MA of the back cover 110 can be deformed as the plurality of opening portions 111 contract or expand while the display part DP is wound or unwound.

Further, because the plurality of opening portions 111 contract or expand, a slip of the display panel 120 disposed in the ductile area MA of the back cover 110 is minimized, such that stress to be applied to the display panel 120 can be minimized.

Referring to FIG. 6, the display panel 120 includes the lower substrate 121, a buffer layer 122, the transistor TR, a gate insulating layer 123, a passivation layer 124, a planarization layer 125, the light-emitting element EM, a first bonding layer AD1, a sealing substrate 128, and a seal member 150.

First, the display panel 120 includes the display area AA and the non-display area NA. The non-display area NA includes a first non-display area NA1, a second non-display area NA2, and a third non-display area NA3.

The first non-display area NA1 is an area extending from the display area AA. The planarization layer 125 extending from the display area AA can be disposed in the first non-display area NA1.

The second non-display area NA2 is an area extending from the first non-display area NA1. The second non-display area NA2 can be an area in which the planarization layer 125 is not disposed. The second non-display area NA2 can be an area between an end of the planarization layer 125 and an end of the sealing substrate 128. Although not illustrated in FIG. 6, in a case in which the second non-display areas NA2 are positioned in left and right edge regions of the display panel 120, the gate drive part or the line part for operating the light-emitting element EM in the display area AA can be disposed in the second non-display area NA2.

The third non-display area NA3 is an area extending from the second non-display area NA2. The third non-display area NA3 can be an outermost peripheral area of the display panel 120. The third non-display area NA3 is an area disposed at an outer periphery from an end of the sealing substrate 128. The third non-display area NA3 can be an area in which the seal member 150 is disposed but the planarization layer 125 is not disposed. In addition, a plurality of pads PE can be disposed in the third non-display area NA3 and receive signals from the printed circuit board 135 and the plurality of flexible films 130.

Next, the lower substrate 121 can be a base member for supporting various components of the display panel 120. The lower substrate 121 can be made of a material having flexibility so that the display panel 120 is wound or unwound. For example, the lower substrate 121 can be made of any one of transparent conducting oxide and an oxide semiconductor. For example, the lower substrate 121 can be made of transparent conducting oxide (TCO) such as indium tin oxide (ITO), indium zinc oxide (IZO), and indium-tin-zinc oxide (ITZO). In addition, the lower substrate 121 can be made of an oxide semiconductor material containing indium (In), gallium (Ga), and zinc (Zn), for example, an oxide semiconductor such as indium-gallium-zinc oxide (IGZO), indium gallium oxide (IGO), and indium-tin-zinc oxide (ITZO). However, the materials and types of transparent conducting oxide and oxide semiconductors are exemplarily provided. The lower substrate 121 can be made of other transparent conducting oxide and oxide semiconductor materials that are not disclosed in the present specification. However, the present disclosure is not limited thereto.

For example, the lower substrate 121 can be formed by depositing the transparent conducting oxide or oxide semiconductor with a very small thickness. Therefore, the lower substrate 121 can have flexibility as the lower substrate 121 has a very small thickness. Further, the display device 100 including the lower substrate 121 having flexibility can be implemented as the flexible display device 100 that can display images even though the display device 100 is folded or rolled up. For example, in a case in which the display device 100 is a rollable display device, the display device 100 can be rolled up around the roller 161 and stored. Therefore, the display device 100 according to the present disclosure can be implemented as the flexible display device 100 such as a foldable display device or a rollable display device by using the lower substrate 121 having flexibility.

The buffer layer 122 is disposed on a top surface of the lower substrate 121. The buffer layer 122 can inhibit moisture and/or oxygen penetrating from the outside of the lower substrate 121 from being diffused. The buffer layer 122 can be made of an inorganic material. For example, the buffer layer 122 can be configured as a single layer or a multilayer made of silicon oxide (SiOx) or silicon nitride (SiNx). However, the present disclosure is not limited thereto.

A pixel part is disposed on the top surface of the lower substrate 121 and a top surface of the buffer layer 122. The pixel part includes a driving element for operating the plurality of light-emitting elements EM and the light-emitting element EM. The pixel part can be disposed to correspond to the display area AA.

Next, referring to FIG. 6, the plurality of transistors TR are disposed on the buffer layer 122 and provided in the display area AA. The plurality of transistors TR can be respectively disposed in the plurality of subpixels in the display area AA. The plurality of transistors TR respectively disposed in the plurality of subpixels can be used as the driving elements of the display device 100. For example, the transistor TR can be a thin-film transistor (TFT). However, the present disclosure is not limited thereto. Hereinafter, the assumption is made that the plurality of transistors TR are thin-film transistors. However, the present disclosure is not limited thereto.

The transistor TR includes a gate electrode GE, an active layer AC, a source electrode SE, and a drain electrode DE.

The gate electrode GE of the transistor TR is disposed on the buffer layer 122. The gate electrode GE can be made of an electrically conductive material, for example, copper (Cu), aluminum (Al), molybdenum (Mo), titanium (Ti), or an alloy thereof. However, the present disclosure is not limited thereto.

The gate insulating layer 123 is disposed on the gate electrode GE. In this case, the gate insulating layer 123 is disposed in the entire display area AA and the entire non-display area NA. The gate insulating layer 123 is a layer for insulating the gate electrode GE and the active layer AC. The gate insulating layer 123 can be made of an inorganic material. For example, the gate insulating layer 123 can be configured as a single layer or multilayer made of silicon oxide (SiOx) or silicon nitride (SiNx). However, the present disclosure is not limited thereto.

The active layer AC is disposed on the gate insulating layer 123. For example, the active layer AC can be made of an oxide semiconductor, amorphous silicon, or polysilicon. However, the present disclosure is not limited thereto.

The source electrode SE and the drain electrode DE are spaced apart from each other and disposed on the active layer AC. The source electrode SE and the drain electrode DE can be electrically connected to the active layer AC. The source electrode SE and the drain electrode DE can each be made of an electrically conductive material, for example, copper (Cu), aluminum (Al), molybdenum (Mo), titanium (Ti), or an alloy thereof. However, the present disclosure is not limited thereto.

The passivation layer 124 is disposed on the transistor TR. The passivation layer 124 can be disposed in the entire display area AA and the entire non-display area NA. The passivation layer 124 is an insulating layer for protecting the components disposed below the passivation layer 124. The passivation layer 124 can be made of an inorganic material. For example, the passivation layer 124 can be configured as a single layer or multilayer made of silicon oxide (SiOx) or silicon nitride (SiNx). However, the present disclosure is not limited thereto. In addition, the passivation layer 124 can be eliminated in accordance with design.

The planarization layer 125 is disposed on the passivation layer 124. The planarization layer 125 can flatten an upper portion of the lower substrate 121 including the transistor TR. The planarization layer 125 is disposed in the entire display area AA and a part of the non-display area NA. Specifically, the planarization layer 125 can be disposed in the display area AA and the first non-display area NA1 but not be disposed in the second non-display area NA2 and the third non-display area NA3. The planarization layer 125 made of an organic material. For example, the planarization layer 125 can be configured as a single layer or multilayer made of an acrylic organic material. However, the present disclosure is not limited thereto.

The first bonding layer AD1 can surround a side surface and a top surface of the planarization layer 125. Specifically, because the planarization layer 125 is made of an organic material, the planarization layer 125 is vulnerable to moisture. If the planarization layer 125 is disposed in the entire display area AA and the entire non-display area NA, like the buffer layer 122, the gate insulating layer 123, and the passivation layer 124, and thus the side surface of the planarization layer 125 is not surrounded by the first bonding layer AD1, moisture penetrating into the side surface of the planarization layer 125 can be transmitted to the display area AA, which can degrade the light-emitting element EM. Therefore, the planarization layer 125 is disposed only in the first non-display area NA1, and the first bonding layer AD1 is disposed to surround the planarization layer 125. Therefore, it is possible to minimize the moisture penetration caused by the planarization layer 125 and improve the reliability of the display device 100.

The buffer layer 122, the gate insulating layer 123, and the passivation layer 124 can be referred to as first inorganic insulating layers IL1. The buffer layer 122, the gate insulating layer 123, and the passivation layer 124 can be disposed to extend not only to the display area AA but also to the entire first non-display area NA1 and a partial region of the second non-display area NA2. An end of the first inorganic insulating layer IL1 can be disposed outward from an end of the planarization layer 125 and disposed inward from an end of the sealing substrate 128. Therefore, the end of the first inorganic insulating layer IL1 can be surrounded by the first bonding layer AD1.

The light-emitting element EM is disposed on the planarization layer 125. The light-emitting element EM is a self-luminance element that emits light. The light-emitting elements EM can be respectively disposed in the plurality of subpixels and operated by the plurality of transistors TR. The light-emitting element EM can include the anode AN, the organic light-emitting layer EL, and the cathode CA.

The anode AN can supply positive holes to the organic light-emitting layer EL and be made of an electrically conductive material having a high work function. For example, the anode AN can be made of tin oxide (TO), indium tin oxide (ITO), indium zinc oxide (IZO), indium tin zinc oxide (ITZO), or the like. However, the present disclosure is not limited thereto.

The bank 126 is disposed on the anode AN. The bank 126 is disposed to overlap the display area AA and cover an edge of the anode AN. The bank 126 can be disposed at a boundary between the adjacent subpixels and reduce mixing of colors of the light beams emitted from the light-emitting element EM of each of the plurality of subpixels. The bank 126 can be made of an insulating material. For example, the bank 126 can be made of polyimide-based resin, acryl-based resin, or benzocyclobutene (BCB)-based resin. However, the present disclosure is not limited thereto.

The organic light-emitting layer EL is disposed on the anode AN exposed from the bank 126. The organic light-emitting layer EL can emit light by receiving the positive holes from the anode AN and receiving the electrons from the cathode CA. The organic light-emitting layer EL can be a red organic light-emitting layer, a green organic light-emitting layer, a blue organic light-emitting layer, and a white organic light-emitting layer depending on the color of the light emitted from the organic light-emitting layer EL. In this case, when the organic light-emitting layer EL is the white organic light-emitting layer, color filters for various colors can be additionally disposed.

The cathode CA is disposed on the organic light-emitting layer EL and the bank 126. The cathode CA can be disposed on at least the entire surface of the display area AA. The cathode CA can supply the electrons to the organic light-emitting layer EL and be made of an electrically conductive material having a low work function. For example, the cathode CA can be made of one or more materials selected from a group consisting of metal such as magnesium (Mg), silver (Ag), and aluminum (Al) and an alloy thereof. However, the present disclosure is not limited thereto. In addition, because the display device 100 is the bottom emission type display device, the cathode CA can reflect the light, which is emitted from the organic light-emitting layer EL, to the lower substrate 121.

In addition, although not illustrated in the drawings, a sealing layer can be disposed in the entire display area AA, the entire first non-display area NA1, and a part of the second non-display area NA2 so as to cover the plurality of light-emitting elements EM. In particular, the sealing layer can be disposed to surround the side surface of the planarization layer 125 and minimize the moisture penetration through the planarization layer 125. The sealing layer can be formed by alternately stacking a plurality of inorganic layers and a plurality of organic layers. For example, the inorganic layer can be made of an inorganic material such as silicon nitride (SiNx), silicon oxide (SiOx), or aluminum oxide (AlOx). The organic layer can be made of epoxy-based polymer or acrylic polymer. However, the present disclosure is not limited thereto.

The sealing substrate 128 can be disposed on the sealing layer. The sealing substrate 128 can be disposed in the entire display area AA, the entire first non-display area NA1, and the entire second non-display area NA2. Therefore, an end of the sealing substrate 128 can overlap a boundary between the second non-display area NA2 and the third non-display area NA3.

To attach the sealing substrate 128, the first bonding layer AD1 is disposed in the display area AA, the first non-display area NA1, and the second non-display area NA2. A top surface of the first bonding layer AD1 can be disposed to contact with the rear surface of the sealing substrate 128. The first bonding layer AD1 can be disposed to surround the side surface of the planarization layer 125 and disposed in an outer peripheral region of the first inorganic insulating layer IL1 so as to contact with the lower substrate 121. Therefore, it is possible to minimize the moisture penetration into the display area AA.

The seal member 150 is disposed on the third non-display area NA3. The seal member 150 is disposed to contact with a top surface of the lower substrate 121 disposed in the third non-display area NA3 and contact with a side surface of the first bonding layer AD1 and a side surface of the sealing substrate 128. In this case, the seal member 150 can be disposed to cover edges of top and bottom surfaces of the sealing substrate 128.

The seal member 150 can minimize the moisture penetration through a lateral portion of the display panel 120. Specifically, the seal member 150 is disposed to contact with a side surface of the first bonding layer AD1, a side surface of the sealing substrate 128, and a top surface of the lower substrate 121. The seal member 150 can be disposed to cover the side surface of the display panel 120 and have a ring shape corresponding to a shape of the display panel 120 in a plan view. However, the present disclosure is not limited thereto. The seal member 150 can be made of a curable material having a modulus value of 50 MPa to 200 MPa, for example. In addition, for example, the seal member 150 can be made of an acrylic, urethane, or silicon-based curable material. However, the present disclosure is not limited thereto.

In addition, referring to FIG. 6, the back cover 110 can be attached onto the sealing substrate 128. The back cover 110 can be attached to the display panel 120 by means of a second bonding layer AD2. The second bonding layer AD2 can be positioned inward from an end of the sealing substrate 128. The second bonding layer AD2 can be made of a material having bondability. The second bonding layer AD2 can be thermosetting or natural curable bonding agent. For example, the second bonding layer AD2 can be an optical clear adhesive (OCA), a pressure sensitive adhesive (PSA), or the like. However, the present disclosure is not limited thereto.

The drawing illustrates that the plurality of opening portions 111 of the back cover 110 are not filled with the second bonding layer AD2. However, some of or all the plurality of opening portions 111 of the back cover 110 can be filled with the second bonding layer AD2. In the case in which the interiors of the plurality of opening portions 111 of the back cover 110 are filled with the second bonding layer AD2, a contact area between the second bonding layer AD2 and the back cover 110 increases, and the separation between the second bonding layer AD2 and the back cover 110.

A boundary between the ductile area MA and the second support area PA2 of the back cover 110 can overlap the sealing substrate 128. Specifically, referring to FIG. 6, the boundary between the ductile area MA and the second support area PA2 of the back cover 110 can overlap the end of the sealing substrate 128. Therefore, all the plurality of opening portions 111 disposed in the ductile area MA adjacent to the second support area PA2 overlap the sealing substrate 128 but are not disposed outside the sealing substrate 128. For example, the ductile area MA of the back cover 110 overlaps only the first non-display area NA1 and the second non-display area NA2 of the non-display area NA but does not overlap the third non-display area NA3.

A substrate of a rollable display device in the related art is made of a material having a flexibility so that a display panel is wound or unwound. For example, the substrate can be made of a plastic material such as polyimide (PI). In the case in which the substrate is made of a plastic material such as polyimide (PI), the substrate is manufactured by coating the substrate with the corresponding material. In the case in which the substrate is manufactured through a process of applying the plastic material as described above, the substrate has a sufficiently large thickness. Therefore, the substrate made of the material such as polyimide (PI) can suppress a situation in which a ductile area of a back cover, particularly, the ductile area of the back cover adjacent to the boundary between the ductile area and the support area is expanded during a repeated winding and unwinding process.

However, various problems occur when the substrate made of a plastic material such as polyimide (PI) is used as the substrate of the rollable display device. For example, because the substrate made of a plastic material is formed by applying and curing a substrate material at a high temperature, there is a problem in that a large amount of time is required, and it is difficult to reduce a thickness to a predetermined level or less. Therefore, Stress generated during winding and unwinding could be increased by the thick substrate. In addition, the plastic substrate increases the likelihood of static electricity in comparison with a substrate in the related art such as a glass substrate. The static electricity can affect various types of lines and driving elements on the plastic substrate, which can damage some components or degrade display quality of the display device.

In addition, particles can be produced during the process of forming the plastic substrate. For example, particles can occur during a process of applying and curing a substrate material to form the plastic substrate. Further, moisture and oxygen can more easily penetrate into the display device because of the particles. Further, several components can be non-uniformly formed on the substrate because of the particles.

Therefore, the lower substrate 121 of the display device 100 according to the embodiment of the present disclosure is made of any one of the transparent conducting oxide and the oxide semiconductor. Therefore, the display device 100 can decrease in thickness, and the display device 100 can increase in flexibility. Therefore, it is possible to mitigate stress applied during the process of repeatedly winding and unwinding the display device 100. In addition, because the lower substrate 121 is made of any one of the transparent conducting oxide and the oxide semiconductor, it is possible to minimize the occurrence of static electricity on the lower substrate 121 and minimize damage or deterioration in display quality caused by the static electricity.

In addition, when the lower substrate 121 is made of the transparent conducting oxide layer or the oxide semiconductor, the lower substrate 121 is formed in a vacuum environment, such that the likelihood of the occurrence of particles is remarkably low, and sizes of the particles are very small even though the particles are produced. Therefore, it is possible to minimize the penetration of moisture and oxygen into the display device 100 and improve the reliability of the display device 100. In addition, because the lower substrate 121 is made of one of a transparent conducting oxide layer or an oxide semiconductor that can be subjected to a laser lift-off (LLO) process, the LLO process can be easily performed on the display device 100 even by using a process and an apparatus in the related art. Therefore, the lower substrate 121 is a layer for facilitating the LLO process, and thus the lower substrate 110 can be referred to as a functional thin-film, a functional thin-film layer, or a functional substrate.

However, it can be difficult for the lower substrate 121 to securely support the ductile area MA of the back cover 110 even though the flexibility is improved when the lower substrate 121 is made of any one of the transparent conducting oxide or the oxide semiconductor and has a very small thickness in the display device 100 according to the embodiment of the present disclosure. In particular, when the boundary between the support area and the ductile area of the back cover is disposed outward from the sealing substrate, there is no component that protects the ductile area disposed outside the sealing substrate from stress.

Therefore, the ductile area of the back cover adjacent to the boundary between the ductile area and the support area of the back cover is expanded during the repeated winding and unwinding process, and the back cover has a length that is longer than a length of the initially manufactured back cover. For this reason, an operation defect can occur.

Therefore, the display device 100 according to the embodiment of the present disclosure is designed such that the boundary between the ductile area MA and the second support area PA2 of the back cover 110 overlaps the end of the sealing substrate 128, thereby reducing the situation in which the ductile area MA is expanded. For example, the plurality of opening portions 111 are designed to overlap only the inside of the sealing substrate 128 having relatively high rigidity.

Therefore, the sealing substrate 128 and the second bonding layer AD2 can fix the back cover 110 even though the plurality of opening portions 111 are contracted or expanded by a rolling force generated during the repeated winding and unwinding process. Therefore, the display device 100 according to the embodiment of the present disclosure can suppress the situation in which the ductile area MA of the back cover 110 is expanded, thereby reducing an operation defect that can occur when the back cover 110 is expanded.

Meanwhile, as illustrated in FIG. 6, the back cover 110 can be spaced apart from the seal member 150 in the third non-display area NA3. Therefore, when the inorganic insulating layer is disposed in the third non-display area, the inorganic insulating layer can receive tensile stress, and thus the inorganic insulating layer can be easily cracked. In addition, an air gap can be formed in a space between the first bonding layer and the seal member adjacent to the substrate during the process of forming the seal member. Because of the air gap formed as described above, the stress applied to the corresponding region can be rapidly changed with respect to the boundary between the seal member and the first bonding layer. Therefore, inorganic cracks can be more easily occur in the inorganic insulating layer made of a material having higher hardness and lower ductility than an organic material of the planarization layer. In a case in which the inorganic insulating layer, such as the buffer layer, the gate insulating layer, or the passivation layer, is cracked by the process of winding and unwinding the display panel, the crack can propagate to the components adjacent to the inorganic insulating layer, and the crack formed in a region adjacent to the air gap can propagate to the display area. In this case, the reliability of the display device can deteriorate.

Therefore, in the display device 100 according to the embodiment of the present disclosure, the end of the first inorganic insulating layer IL1 including the buffer layer 122, the gate insulating layer 123, and the passivation layer 124 can be disposed inward from the end of the sealing substrate

128. Specifically, the first inorganic insulating layer IL1 is not present in the vicinity of the boundary between the second non-display area NA2 and the third non-display area NA3, and the end of the first inorganic insulating layer IL1 can be disposed to surround the first bonding layer AD1 or the sealing layer, thereby reducing a crack defect. For example, the first inorganic insulating layer IL1 is not disposed in the third non-display area NA3 in which the seal member 150 and the back cover 110 are spaced apart from each other. Further, the first inorganic insulating layer IL1 is not disposed in the end boundary region of the sealing substrate 128 where there is a high likelihood that cracks occur because of a rapid change in stress. Therefore, it is possible to more fundamentally suppress the likelihood of the occurrence of cracks.

Figure 7:
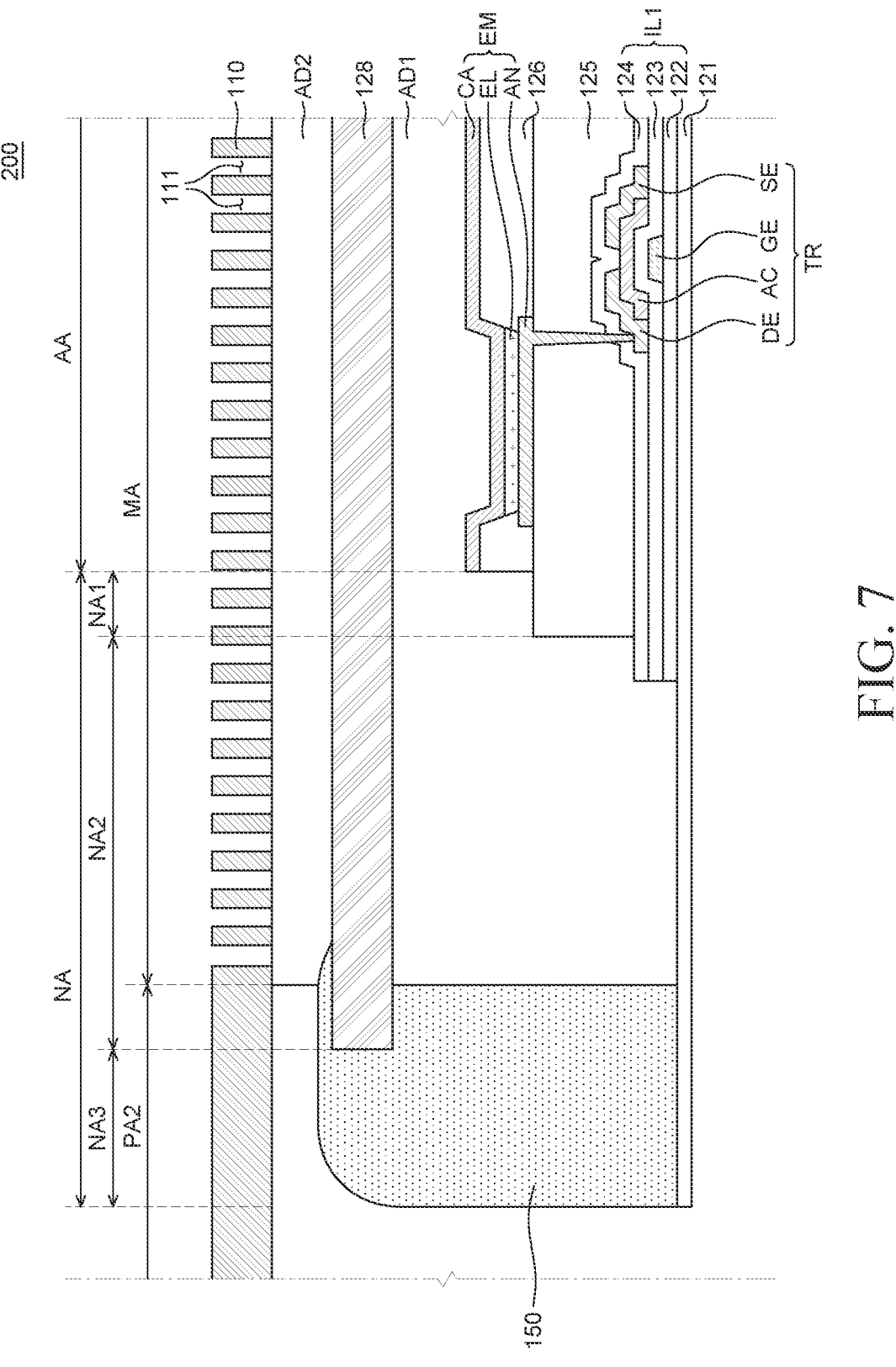
FIG. 7 is a cross-sectional view of a display device according to another embodiment of the present disclosure.

FIG. 7 is a cross-sectional view of a display device according to another embodiment of the present disclosure. A display device 200 illustrated in FIG. 7 is substantially identical in configuration to the display device 100 illustrated in FIGS. 1 to 6, except for a position of the boundary between the ductile area MA and the second support area PA2 of the back cover 110. Therefore, repeated descriptions of the identical components will be omitted or may be briefly discussed.

Referring to FIG. 7, the boundary between the ductile area MA and the second support area PA2 of the back cover 110 can overlap the sealing substrate 128. Specifically, the boundary between the ductile area MA and the second support area PA2 of the back cover 110 is disposed inward from the end of the sealing substrate 128, such that a partial region adjacent to the ductile area MA in the second support area PA2 can overlap the sealing substrate 128. Therefore, all the plurality of opening portions 111 disposed in the ductile area MA adjacent to the second support area PA2 overlap the sealing substrate 128 but are not disposed outside the sealing substrate 128. For example, the ductile area MA of the back cover 110 overlaps only the first non-display area NA1 and the second non-display area NA2 of the non-display area NA but does not overlap the third non-display area NA3.

The display device 200 according to another embodiment of the present disclosure is designed such that the boundary between the ductile area MA and the second support area PA2 of the back cover 110 overlaps the sealing substrate 128, thereby reducing the situation in which the ductile area MA is expanded. For example, the plurality of opening portions 111 are designed to overlap only the inside of the sealing substrate 128 having relatively high rigidity. Therefore, the sealing substrate 128 and the second bonding layer AD2 can fix the back cover 110 even though the plurality of opening portions 111 are contracted or expanded by a rolling force generated during the repeated winding and unwinding process. Therefore, the display device 200 according to another embodiment of the present disclosure can suppress the situation in which the ductile area MA of the back cover 110 is expanded, thereby reducing an operation defect that can occur when the back cover 110 is expanded.

In addition, the display device 200 according to another embodiment of the present disclosure is designed such that the boundary between the ductile area MA and the second support area PA2 of the back cover 110 is positioned further inside the sealing substrate 128 than the end of the sealing substrate 128. Therefore, it is possible to inhibit the boundary between the ductile area MA and the second support area PA2 from being disposed outward from the end of the sealing substrate 128 by a process error during a process of bonding the sealing substrate 128 and the back cover 110.

Figure 8:
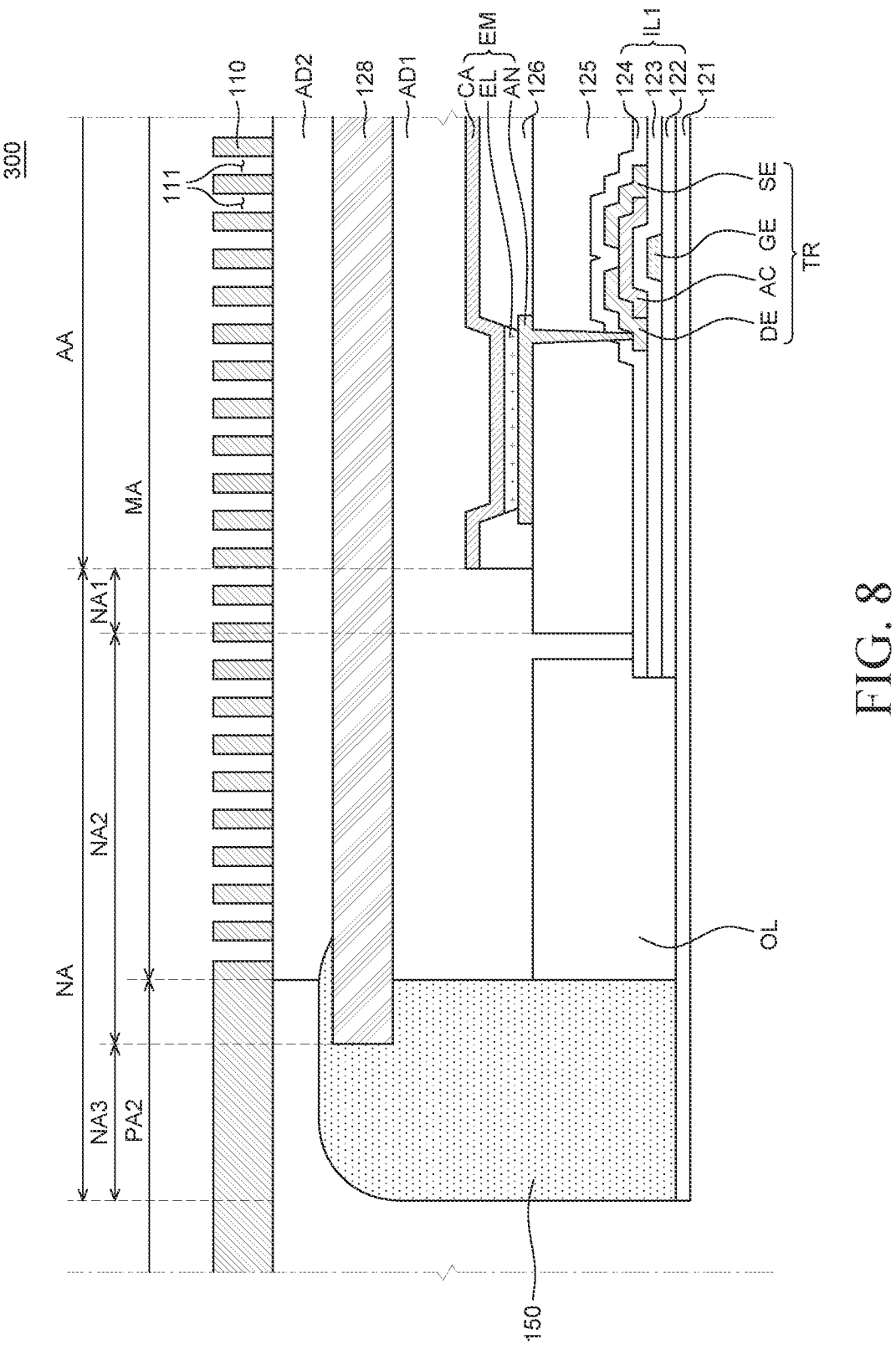
FIG. 8 is a cross-sectional view of a display device according to still another embodiment of the present disclosure.

FIG. 8 is a cross-sectional view of a display device according to still another embodiment of the present disclosure. A display device 300 illustrated in FIG. 8 is substantially identical in configuration to the display device 200 illustrated in FIG. 7, except that the display device 300 further includes an organic insulating layer OL. Therefore, repeated descriptions of the identical components will be omitted or may be briefly discussed.

Referring to FIG. 8, a first inorganic insulating layer IL1 of the display device 300 can be disposed in the entire display area AA, the entire first non-display area NA1, and a partial region of the second non-display area NA2. For example, an end of the first inorganic insulating layer IL1 can be disposed inward from the end of the sealing substrate 128, and the first bonding layer AD1 or the sealing layer can surround the end region of the first inorganic insulating layer IL1. Therefore, a region in which the first bonding layer AD1 and the lower substrate 121 contact with each other is present between the end of the first inorganic insulating layer IL1 and the seal member 150.

Referring to FIG. 8, the organic insulating layer OL is disposed in the second non-display area NA2 so as to surround the outer peripheral region of the first inorganic insulating layer IL1 and contact with the lower substrate 121. In this case, the organic insulating layer OL can be disposed to be spaced apart from the planarization layer 125. One side of the organic insulating layer OL can be disposed to cover the end of the first inorganic insulating layer IL1 and surround the first inorganic insulating layer IL1. In addition, are illustrated in FIG. 8, the other side of the organic insulating layer OL can contact with the seal member 150. However, the present disclosure is not limited thereto. The first bonding layer AD1 can be disposed to surround the other side of the organic insulating layer OL.

The organic insulating layer OL and the planarization layer 125 can be simultaneously formed. Therefore, the organic insulating layer OL can be made of the same material and have the same height as the planarization layer 125. However, the present disclosure is not limited thereto. The organic insulating layer OL can be formed in a separate process separately from the planarization layer 125.

In the display device 300 according to still another embodiment of the present disclosure, the organic insulating layer OL can be disposed in the second non-display area NA2 in order to more smoothly perform the LLO process. The lower substrate 121 can be formed on a temporary substrate having a sacrificial layer, and then various constituent elements can be formed on the lower substrate 121. The sacrificial layer can be made of, for example, hydrogenated amorphous silicon or amorphous silicon hydrogenated and doped with impurities. Further, when laser beams are emitted to the lower portion of the temporary substrate after the display device 300 is completely manufactured, the sacrificial layer can be dehydrogenated, and the sacrificial layer and the temporary substrate can be separated from the lower substrate 121. In this case, the transparent conducting oxide and the oxide semiconductor are the materials that can be subjected to the LLO process together with the sacrificial layer and the temporary substrate. Therefore, even though the lower substrate 121 is made of any one of the transparent conducting oxide and the oxide semiconductor, the lower substrate 121 and the temporary substrate can be easily separated.

However, the region in which the lower substrate 121 made of the transparent conducting oxide or the oxide semiconductor is in contact with the first bonding layer AD1 can require higher energy density (E/D) during the LLO process. For example, in the case in which the lower substrate 121 made of the transparent conducting oxide or the oxide semiconductor and the first bonding layer AD1 are disposed to be in direct contact with each other, a large amount of energy can be required to separate the lower substrate 121 and the first bonding layer AD1.

Therefore, in the display device 300 according to yet another embodiment of the present disclosure, the organic insulating layer OL is disposed in the second non-display area NA2 so as to surround the outer peripheral region of the first inorganic insulating layer IL1, such that the LLO process can be relatively easily performed even on the second non-display area NA2 during the process of manufacturing the display device 300.

In addition, in the display device 300 according to still another embodiment of the present disclosure, the organic insulating layer OL can be structured to be separated from the planarization layer 125. Because the organic material constituting the organic insulating layer OL is a material relatively vulnerable to the moisture penetration, moisture can more easily penetrate into the display area from the outside of the display device in a case in which the organic insulating layer and the planarization layer are connected. Therefore, in the display device 300 according to still another embodiment of the present disclosure, the organic insulating layer OL and the planarization layer 125 can be separated, thereby suppressing the moisture penetration from the outside.

Figure 9:
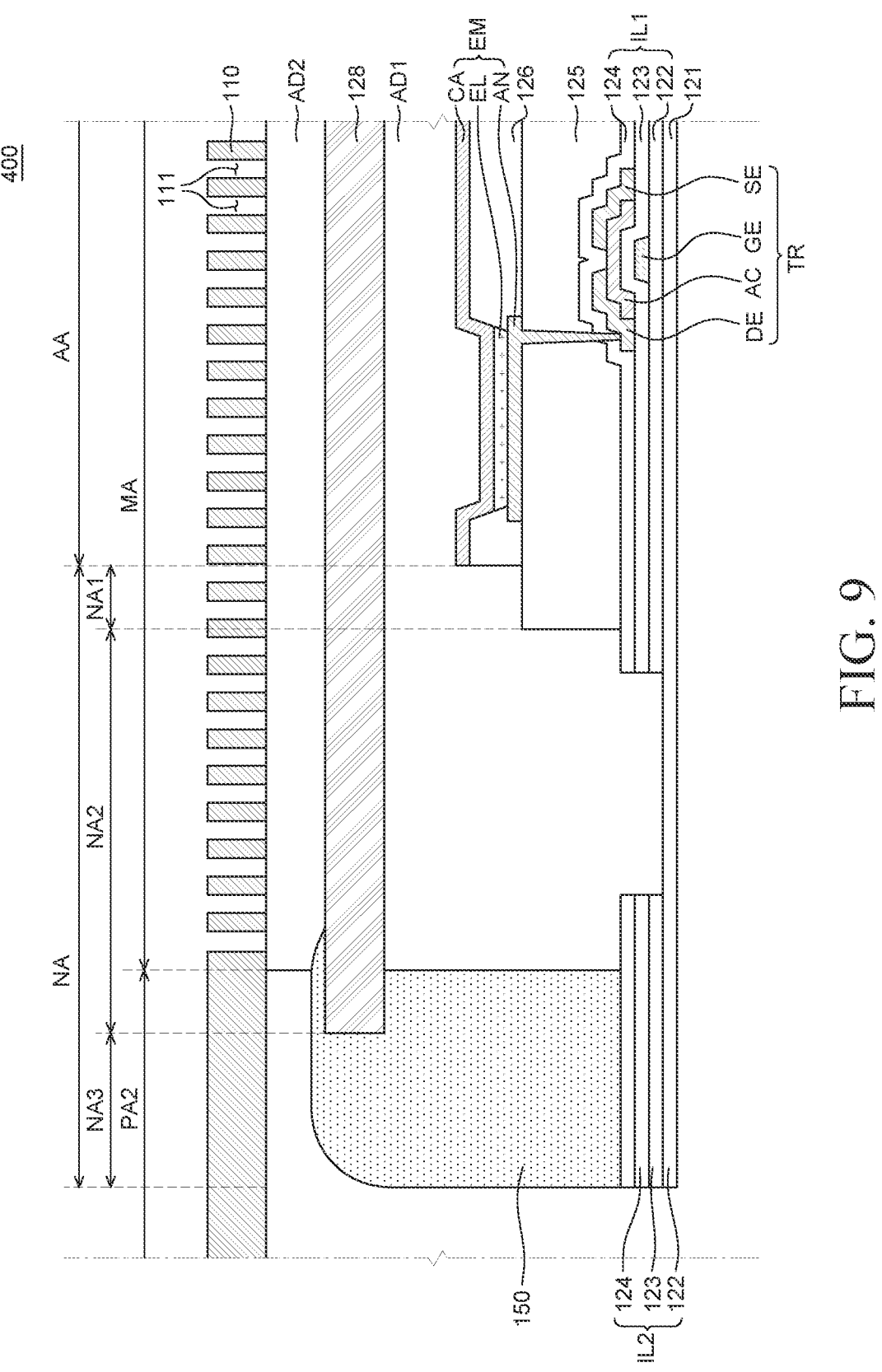
FIG. 9 is a cross-sectional view of a display device according to yet another embodiment of the present disclosure.

FIG. 9 is a cross-sectional view of a display device according to yet another embodiment of the present disclosure. A display device 400 illustrated in FIG. 9 is substantially identical in configuration to the display device 200 illustrated in FIG. 7, except that the display device 400 further includes a second inorganic insulating layer IL2. Therefore, repeated descriptions of the identical components will be omitted or may be briefly discussed.

Referring to FIG. 9, the second inorganic insulating layer IL2 is spaced apart from the first inorganic insulating layer IL1 and disposed below the seal member 150. The second inorganic insulating layer IL2 can be disposed in the third non-display area NA3 and a partial region of the second non-display area NA2. For example, the second inorganic insulating layer IL2 can be disposed to overlap the end of the sealing substrate 128. However, the present disclosure is not limited thereto. The second inorganic insulating layer IL2 can be disposed only in the third non-display area NA3 or only in a partial region of the third non-display area NA3.

The second inorganic insulating layer IL2 can have the same layered structure or be made of the same material as the first inorganic insulating layer IL1. For example, the second inorganic insulating layer IL2 can also be defined as including the buffer layer 122, the gate insulating layer 123, and the passivation layer 124. However, the buffer layer 122, the gate insulating layer 123, and the passivation layer 124, which constitute the first inorganic insulating layer IL1, can be separated from the buffer layer 122, the gate insulating layer 123, and the passivation layer 124 that constitute the second inorganic insulating layer IL2. Therefore, the first bonding layer AD1 can be disposed in the space between the first inorganic insulating layer IL1 and the second inorganic insulating layer IL2.

In the display device 400 according to yet another embodiment of the present disclosure, the second inorganic insulating layer IL2 can be disposed in the third non-display area NA3 and a part of the second non-display area NA2, thereby suppressing the moisture penetration. In comparison with the material constituting the seal member 150 disposed at the outermost periphery, the inorganic material constituting the second inorganic insulating layer IL2 relatively easily suppresses the moisture penetration. Therefore, in the display device 400 according to yet another embodiment of the present disclosure, the second inorganic insulating layer IL2 made of an inorganic material can be disposed at the outermost periphery, thereby suppressing the moisture penetration from the outside.

In addition, in the display device 400 according to yet another embodiment of the present disclosure, the first inorganic insulating layer IL1 and the second inorganic insulating layer IL2 are disposed to be spaced apart from each other. The configuration in which the second inorganic insulating layer IL2 is disposed at the outermost periphery as described above is effective in suppressing the moisture penetration. However, there is a likelihood that cracks can occur in the region in which the second inorganic insulating layer IL2 is disposed. Therefore, in a case in which the first inorganic insulating layer IL1 and the second inorganic insulating layer IL2 are connected to each other, the crack formed in the second inorganic insulating layer IL2 can propagate to the first inorganic insulating layer IL1.

In contrast, in the display device 400 according to yet another embodiment of the present disclosure, the first inorganic insulating layer IL1 and the second inorganic insulating layer IL2 are disposed to be separated from each other, and the first bonding layer AD1 is disposed in the space between the first inorganic insulating layer IL1 and the second inorganic insulating layer IL2. Therefore, even though cracks occur in the second inorganic insulating layer IL2, it is possible to inhibit the crack from propagating to the first inorganic insulating layer IL1.

Figure 10:
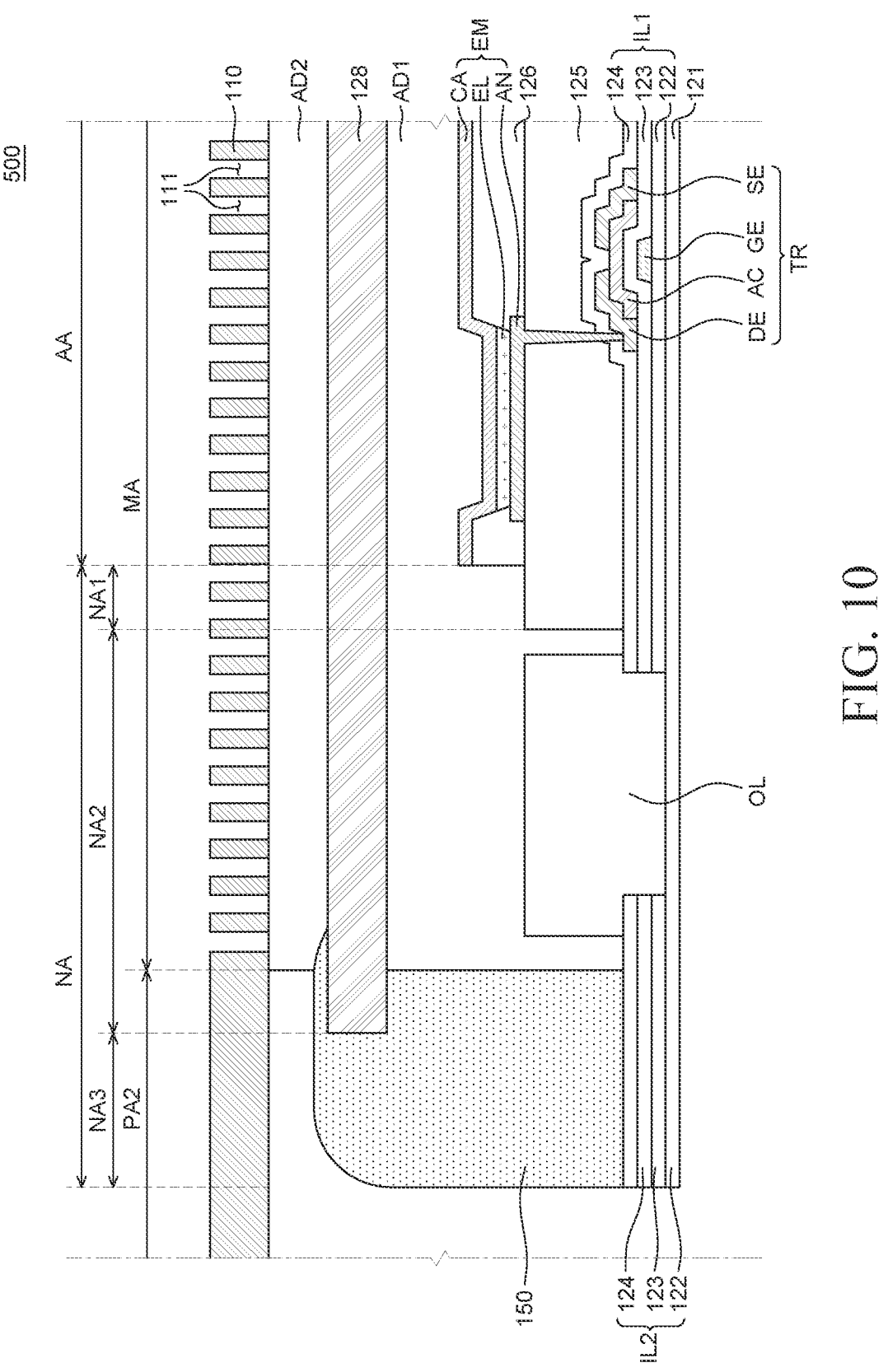
FIG. 10 is a cross-sectional view of a display device according to still yet another embodiment of the present disclosure.

FIG. 10 is a cross-sectional view of a display device according to still yet another embodiment of the present disclosure. A display device 500 illustrated in FIG. 10 is substantially identical in configuration to the display device 400 illustrated in FIG. 9, except that the display device 500 further includes an organic insulating layer OL. Therefore, repeated descriptions of the identical components will be omitted or may be briefly discussed.

Referring to FIG. 10, the organic insulating layer OL is disposed in the second non-display area NA2 so as to surround the outer peripheral region of the first inorganic insulating layer IL1. In this case, the organic insulating layer OL can be disposed to be spaced apart from the planarization layer 125. One side of the organic insulating layer OL can be disposed to cover the end of the first inorganic insulating layer IL1 and surround the first inorganic insulating layer IL1. In addition, the other side of the organic insulating layer OL can be disposed to surround the second inorganic insulating layer IL2. For example, the organic insulating layer OL can be disposed to fill the space between the first inorganic insulating layer IL1 and the second inorganic insulating layer IL2. In this case, as illustrated in FIG. 10, the other side of the organic insulating layer OL can be disposed to be surrounded by the first bonding layer AD1. However, the present disclosure is not limited thereto. The other side of the organic insulating layer OL can be disposed to be in contact with the seal member 150.

The organic insulating layer OL and the planarization layer 125 can be simultaneously formed. Therefore, the organic insulating layer OL can be made of the same material and have the same height as the planarization layer 125. However, the present disclosure is not limited thereto. The organic insulating layer OL can be formed in a separate process separately from the planarization layer 125.

In the display device 500 according to still yet another embodiment of the present disclosure, the organic insulating layer OL can be disposed in the second non-display area NA2 in order to more smoothly perform the LLO process. For example, the organic insulating layer OL is disposed in the space between the first inorganic insulating layer IL1 and the second inorganic insulating layer IL2 and contacts with the lower substrate 121. The first bonding layer AD1 can be disposed on the organic insulating layer OL. Therefore, the LLO process can be easily performed with a relatively small amount of energy in comparison with the case in which the lower substrate 121 and the first bonding layer AD1 are disposed to directly contact with each other.

In addition, in the display device 500 according to still yet another embodiment of the present disclosure, the organic insulating layer OL can be structured to be separated from the planarization layer 125. Because the organic material constituting the organic insulating layer OL is a material relatively vulnerable to the moisture penetration, moisture can more easily penetrate into the display area from the outside of the display device in a case in which the organic insulating layer and the planarization layer are connected. Therefore, in the display device 500 according to still yet another embodiment of the present disclosure, the organic insulating layer OL and the planarization layer 125 can be separated, thereby suppressing the moisture penetration from the outside.

Figure 11:
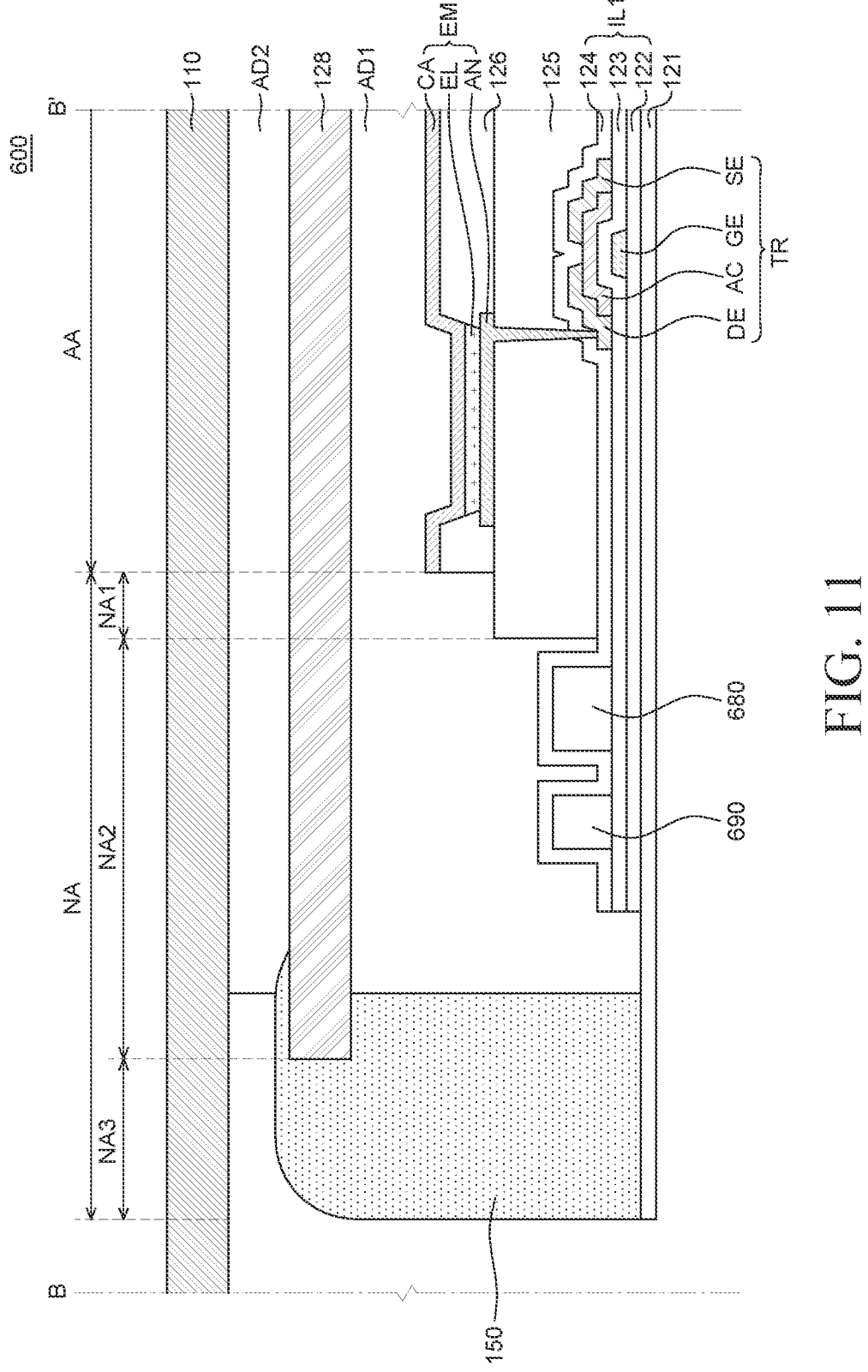
FIG. 11 is a cross-sectional view of a display device according to a further embodiment of the present disclosure.

FIG. 11 is a cross-sectional view of a display device according to a further embodiment of the present disclosure. More specifically, FIG. 11 is a cross-sectional view taken along line B-B' in FIG. 4. A display device 600 illustrated in FIG. 11 is substantially identical in configuration to the display device 100 illustrated in FIGS. 1 to 6, except that a left region, i.e., a gate-in-panel (GIP) region is provided in an edge region of the back cover 110 protruding from the display panel 120. Therefore, repeated descriptions of the identical components will be omitted or may be briefly discussed.

Referring to FIG. 11, a gate drive part 680 and a line part 690 are disposed on the gate insulating layer 123 in the second non-display area NA2. The gate drive part 680 and the line part 690 can be disposed in the second non-display area NA2 adjacent to the left and right edges of the display panel 120. In this case, because the gate drive part 680 and the line part 690 are disposed on the lower substrate 121, the region in which the gate drive part 680 and the line part 690 are disposed can be referred to as a GIP region.

The gate drive part 680 can output a gate voltage and a light-emitting control voltage under the control of the timing controller, select the subpixel to be charged with the data voltage through a line such as a gate line of a light-emitting control signal line, and adjust a light-emitting timing. The gate drive part 680 can shift the gate voltage and the light-emitting control voltage by using a shift register and sequentially supply the gate voltage and the light-emitting control voltage.

The line part 690 can include a plurality of clock signal lines and a plurality of ground lines that transmit a plurality of clock signals. However, the present disclosure is not limited thereto. The line part can further include a signal line for transmitting an additional signal.

Therefore, in the display device 600 according to a further embodiment of the present disclosure, the end of the first inorganic insulating layer IL1 including the buffer layer 122, the gate insulating layer 123, and the passivation layer 124 can be disposed inward from the end of the sealing substrate 128. Specifically, the first inorganic insulating layer IL1 is not present in the vicinity of the boundary between the second non-display area NA2 and the third non-display area NA3, and the end of the first inorganic insulating layer IL1 can be disposed to surround the first bonding layer AD1 or the sealing layer, thereby reducing a crack defect. For example, the first inorganic insulating layer IL1 is not disposed in the third non-display area NA3 in which the seal member 150 and the back cover 110 are spaced apart from each other. Further, the first inorganic insulating layer IL1 is not disposed in the end boundary region of the sealing substrate 128 where there is a high likelihood that cracks occur because of a rapid change in stress. Therefore, it is possible to more fundamentally suppress the likelihood of the occurrence of cracks.

Figure 12:
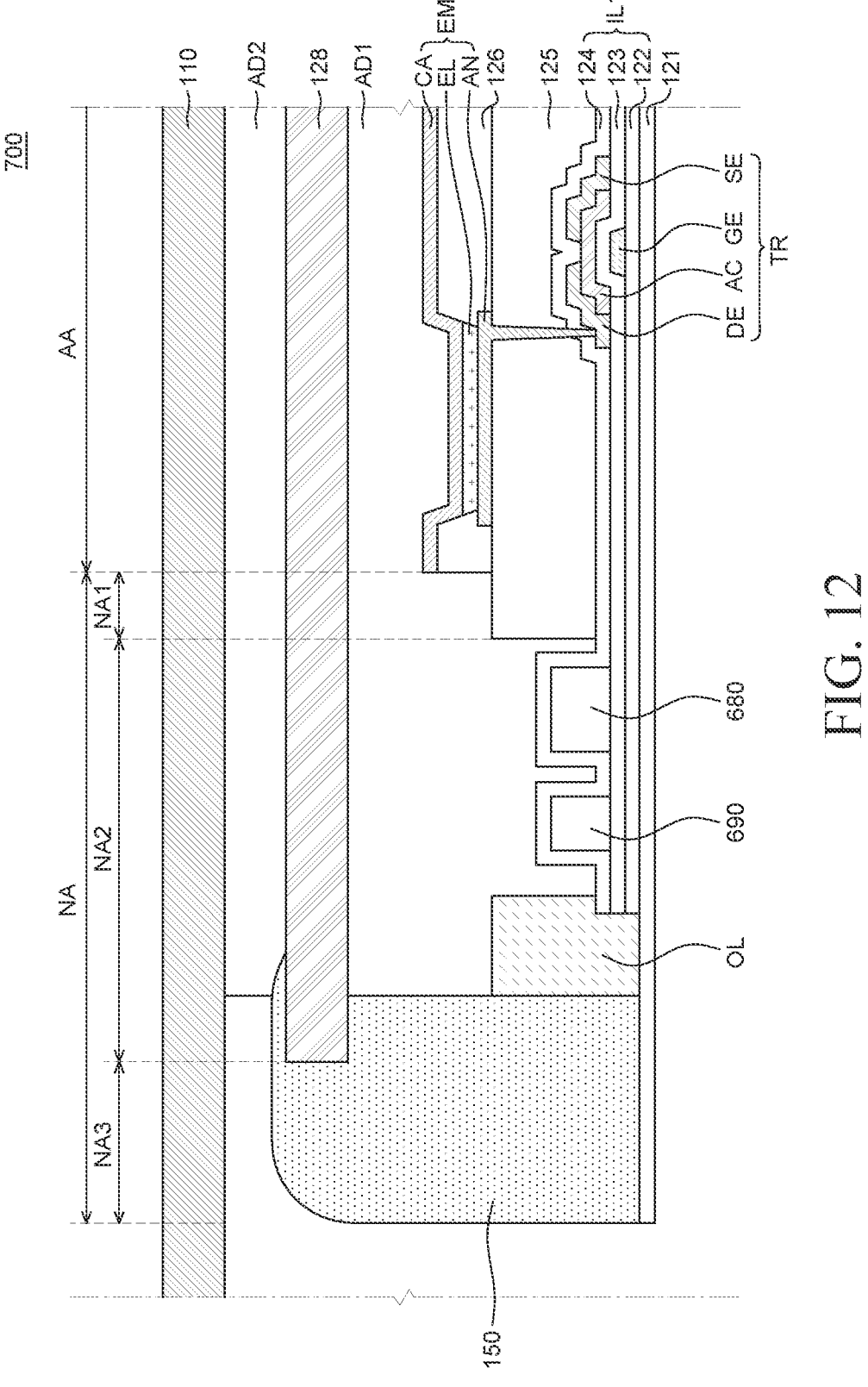
FIG. 12 is a cross-sectional view of a display device according to another further embodiment of the present disclosure.

FIG. 12 is a cross-sectional view of a display device according to another further embodiment of the present disclosure. A display device 700 illustrated in FIG. 12 is substantially identical in configuration to the display device 600 illustrated in FIG. 11, except that the display device 700 further includes an organic insulating layer OL. Therefore, repeated descriptions of the identical components will be omitted or may be briefly discussed.

Referring to FIG. 12, the organic insulating layer OL is disposed in the second non-display area NA2 so as to surround the outer peripheral region of the first inorganic insulating layer IL1 and contact with the lower substrate 121. In this case, the organic insulating layer OL can be disposed to be spaced apart from the planarization layer 125. One side of the organic insulating layer OL can be disposed to cover the end of the first inorganic insulating layer IL1 and surround the first inorganic insulating layer IL1. In addition, are illustrated in FIG. 12, the other side of the organic insulating layer OL can contact with the seal member 150. However, the present disclosure is not limited thereto. The first bonding layer AD1 can be disposed to surround the other side of the organic insulating layer OL.

The organic insulating layer OL and the planarization layer 125 can be simultaneously formed. Therefore, the organic insulating layer OL can be made of the same material and have the same height as the planarization layer 125. However, the present disclosure is not limited thereto. The organic insulating layer OL can be formed in a separate process separately from the planarization layer 125.

In the display device 700 according to another further embodiment of the present disclosure, the organic insulating layer OL can be disposed in the second non-display area NA2 in order to more smoothly perform the LLO process. For example, the organic insulating layer OL can be disposed to contact with the lower substrate 121 in the second non-display area NA2, and the first bonding layer AD1 can be disposed on the organic insulating layer OL. Therefore, the LLO process can be easily performed with a relatively small amount of energy in comparison with the case in which the lower substrate 121 and the first bonding layer AD1 are disposed to directly contact with each other.

In addition, in the display device 700 according to another further embodiment of the present disclosure, the organic insulating layer OL can be structured to be separated from the planarization layer 125. Therefore, in the display device 700 according to another further embodiment of the present disclosure, the organic insulating layer OL and the planarization layer 125 can be separated, thereby suppressing the moisture penetration from the outside.

Figure 13:
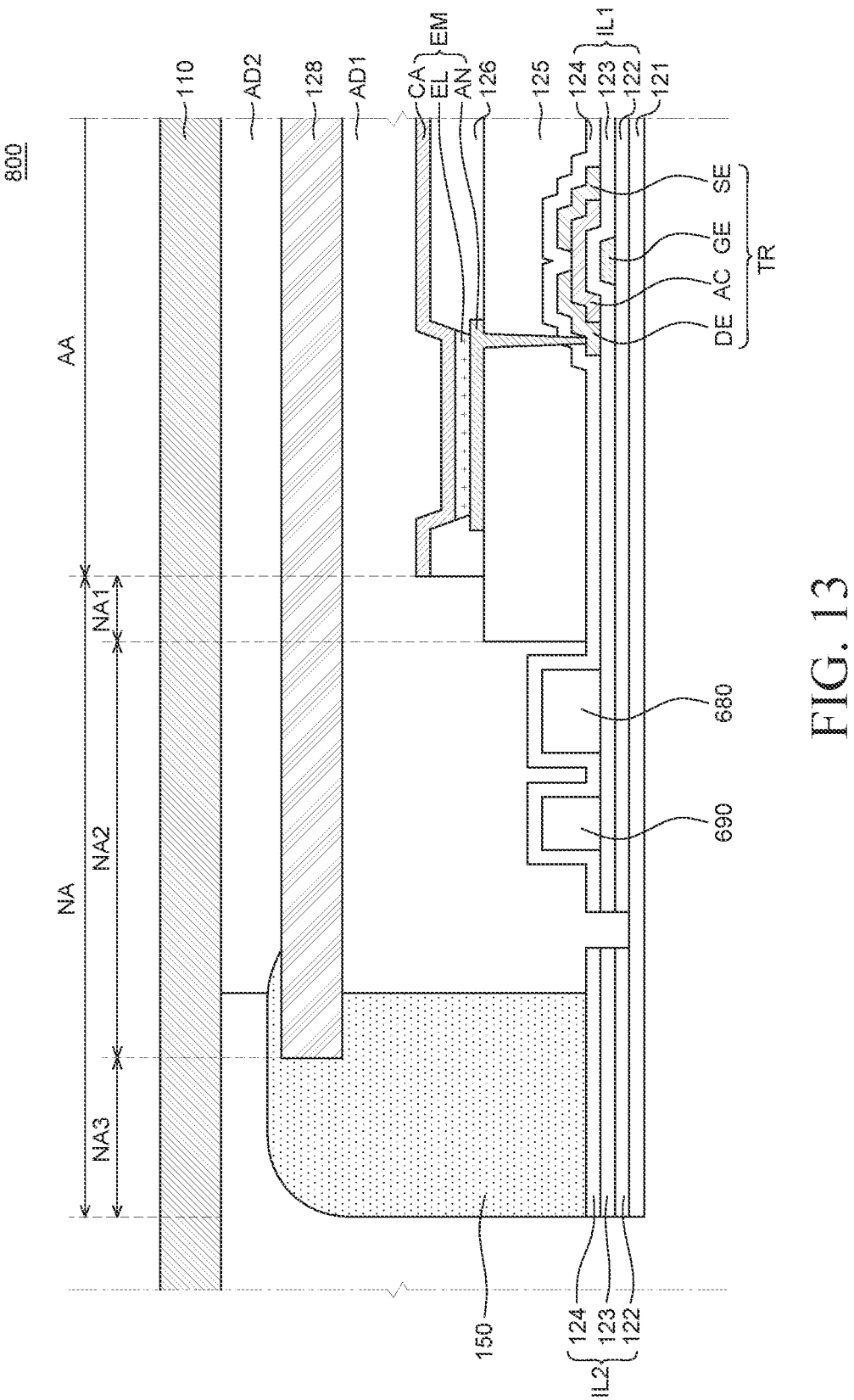
FIG. 13 is a cross-sectional view of a display device according to still another further embodiment of the present disclosure.

FIG. 13 is a cross-sectional view of a display device according to still another further embodiment of the present disclosure. A display device 800 illustrated in FIG. 13 is substantially identical in configuration to the display device 600 illustrated in FIG. 11, except that the display device 800 further includes a second inorganic insulating layer IL2. Therefore, repeated descriptions of the identical components will be omitted or may be briefly discussed.

Referring to FIG. 13, the second inorganic insulating layer IL2 is spaced apart from the first inorganic insulating layer IL1 and disposed below the seal member 150. The second inorganic insulating layer IL2 can be disposed in the third non-display area NA3 and a partial region of the second non-display area NA2. For example, the second inorganic insulating layer IL2 can be disposed to overlap the end of the sealing substrate 128. However, the present disclosure is not limited thereto. The second inorganic insulating layer IL2 can be disposed only in the third non-display area NA3 or only in a partial region of the third non-display area NA3.

The second inorganic insulating layer IL2 can have the same layered structure or be made of the same material as the first inorganic insulating layer IL1. For example, the second inorganic insulating layer IL2 can also be defined as including the buffer layer 122, the gate insulating layer 123, and the passivation layer 124. However, the buffer layer 122, the gate insulating layer 123, and the passivation layer 124, which constitute the first inorganic insulating layer IL1, can be separated from the buffer layer 122, the gate insulating layer 123, and the passivation layer 124 that constitute the second inorganic insulating layer IL2. Therefore, the first bonding layer AD1 can be disposed in the space between the first inorganic insulating layer IL1 and the second inorganic insulating layer IL2.

In the display device 800 according to still another further embodiment of the present disclosure, the second inorganic insulating layer IL2 can be disposed in the third non-display area NA3 and a part of the second non-display area NA2, thereby suppressing the moisture penetration. In comparison with the material constituting the seal member 150 disposed at the outermost periphery, the inorganic material constituting the second inorganic insulating layer IL2 relatively easily suppresses the moisture penetration. Therefore, in the display device 800 according to still another further embodiment of the present disclosure, the second inorganic insulating layer IL2 made of an inorganic material can be disposed at the outermost periphery, thereby suppressing the moisture penetration from the outside.

In addition, in the display device 800 according to still another further embodiment of the present disclosure, the first inorganic insulating layer IL1 and the second inorganic insulating layer IL2 are disposed to be spaced apart from each other. Therefore, in the display device 800 according to yet another further embodiment of the present disclosure, the first bonding layer AD1 is disposed in the space between the first inorganic insulating layer IL1 and the second inorganic insulating layer IL2. Therefore, even though cracks occur in the second inorganic insulating layer IL2, it is possible to inhibit the crack from propagating to the first inorganic insulating layer IL1.

Figure 14:
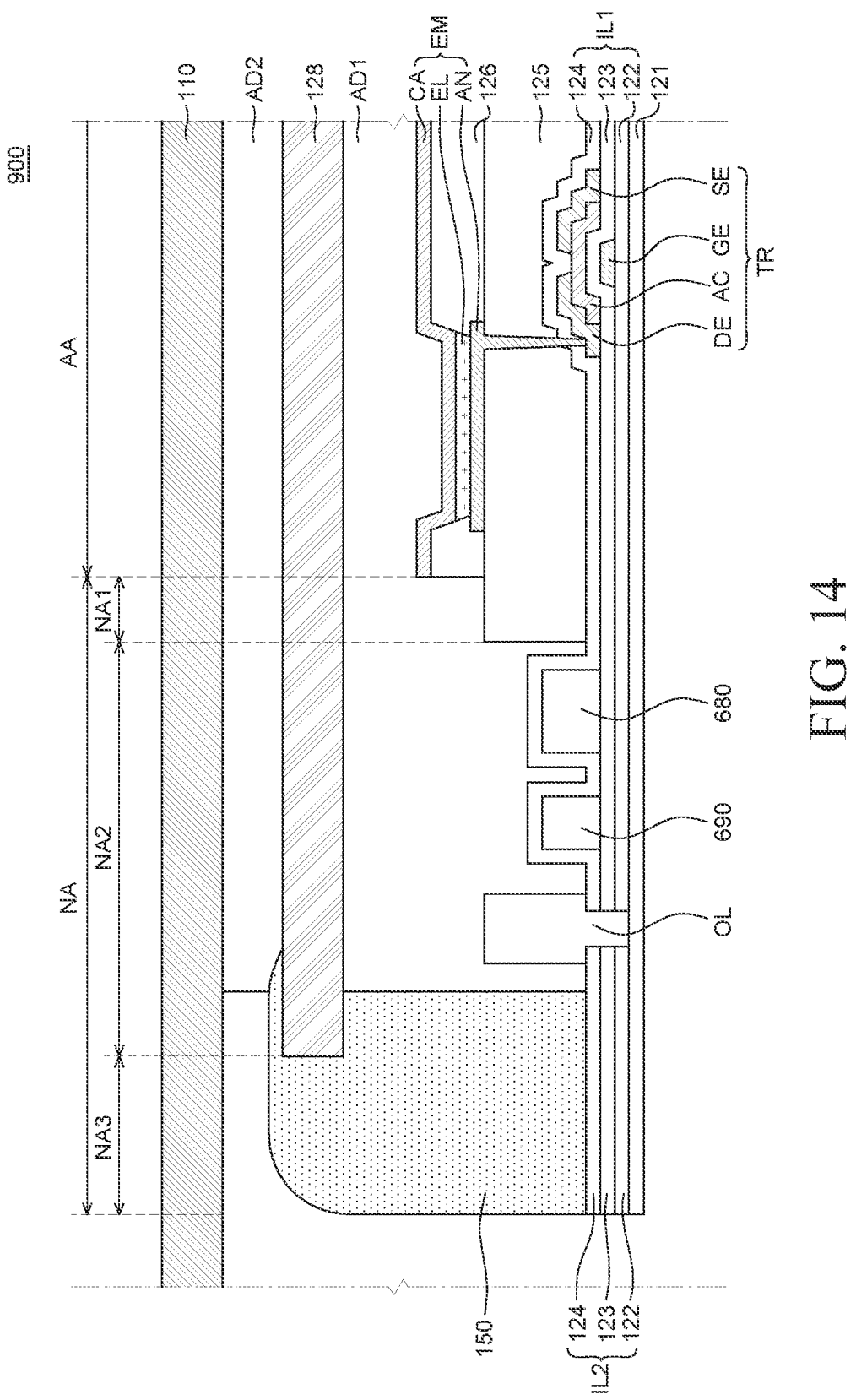
FIG. 14 is a cross-sectional view of a display device according to yet another further embodiment of the present disclosure.

FIG. 14 is a cross-sectional view of a display device according to yet another further embodiment of the present disclosure. A display device 900 illustrated in FIG. 14 is substantially identical in configuration to the display device 800 illustrated in FIG. 13, except that the display device 900 further includes an organic insulating layer OL. Therefore, repeated descriptions of the identical components will be omitted or may be briefly discussed.

Referring to FIG. 14, the organic insulating layer OL is disposed in the second non-display area NA2 so as to surround the outer peripheral region of the first inorganic insulating layer IL1. In this case, the organic insulating layer OL can be disposed to be spaced apart from the planarization layer 125. One side of the organic insulating layer OL can be disposed to cover the end of the first inorganic insulating layer IL1 and surround the first inorganic insulating layer IL1. In addition, the other side of the organic insulating layer OL can be disposed to surround the second inorganic insulating layer IL2. For example, the organic insulating layer OL can be disposed to fill the space between the first inorganic insulating layer IL1 and the second inorganic insulating layer IL2. In this case, as illustrated in FIG. 14, the other side of the organic insulating layer OL can be disposed to be surrounded by the first bonding layer AD1. However, the present disclosure is not limited thereto. The other side of the organic insulating layer OL can be disposed to be in contact with the seal member 150.

The organic insulating layer OL and the planarization layer 125 can be simultaneously formed. Therefore, the organic insulating layer OL can be made of the same material and have the same height as the planarization layer 125. However, the present disclosure is not limited thereto. The organic insulating layer OL can be formed in a separate process separately from the planarization layer 125.

In the display device 900 according to yet another further embodiment of the present disclosure, the organic insulating layer OL can be disposed in the second non-display area NA2 in order to more smoothly perform the LLO process. For example, the organic insulating layer OL is disposed in the space between the first inorganic insulating layer IL1 and the second inorganic insulating layer IL2 and contacts with the lower substrate 121. The first bonding layer AD1 can be disposed on the organic insulating layer OL. Therefore, the LLO process can be easily performed with a relatively small amount of energy in comparison with the case in which the lower substrate 121 and the first bonding layer AD1 are disposed to directly contact with each other.

In addition, in the display device 900 according to yet another further embodiment of the present disclosure, the organic insulating layer OL can be structured to be separated from the planarization layer 125. Because the organic material constituting the organic insulating layer OL is a material relatively vulnerable to the moisture penetration, moisture can more easily penetrate into the display area AA from the outside of the display device in a case in which the organic insulating layer OL and the planarization layer 125 are connected. Therefore, in the display device 900 according to yet another further embodiment of the present disclosure, the organic insulating layer OL and the planarization layer 125 can be separated, thereby suppressing the moisture penetration from the outside.

The exemplary embodiments of the present disclosure can also be described as follows:

According to an aspect of the present disclosure, there is provided a display device. The display device comprises a lower substrate made of a transparent conducting oxide or an oxide semiconductor, a first inorganic insulating layer disposed on the lower substrate, a planarization layer disposed on the first inorganic insulating layer, a light-emitting element disposed on the planarization layer, a sealing substrate disposed on the first inorganic insulating layer, the planarization layer, and the light-emitting element, a back cover disposed on the sealing substrate and having a plurality of opening portions; and a roller part configured to wind or unwind the back cover, wherein an end of the first inorganic insulating layer is disposed inward from an end of the sealing substrate.

The display device can further comprise a first bonding layer configured to attach the sealing substrate to the lower substrate, wherein the first bonding layer is disposed to surround the first inorganic insulating layer.

The first bonding layer can be disposed in an outer peripheral region of the first inorganic insulating layer and contacts with the lower substrate.

The display device can further comprise an organic insulating layer disposed to surround an outer peripheral region of the first inorganic insulating layer.

The display device can further comprise a second inorganic insulating layer spaced apart from the first inorganic insulating layer and configured to overlap the end of the sealing substrate.

The display device can further comprise an organic insulating layer disposed to fill a space between the first inorganic insulating layer and the second inorganic insulating layer.

The second inorganic insulating layer can be made of the same material as the first inorganic insulating layer.

The back cover can comprise a first support area, a ductile area extending from the first support area and having the plurality of opening portions and a second support area extending from the ductile area and fastened to the roller part, and wherein a boundary between the ductile area and the second support area overlaps the sealing substrate.

The boundary between the ductile area and the second support area can overlap the end of the sealing substrate.

The boundary between the ductile area and the second support area can be positioned further inside than the end of the sealing substrate.

The display device can further comprise a second bonding layer configured to attach the back cover to the display panel, wherein the second bonding layer is positioned inward from the end of the sealing substrate.

The display device can further comprise a flexible film disposed in the first support area and configured to supply a signal to the light-emitting element.

According to another aspect of the present disclosure, there is provided a display device. The display device comprises a display panel comprising a functional thin-film layer, an inorganic insulating layer, a planarization layer, a light-emitting element, and a sealing substrate, the display panel being divided into a display area and a non-display area, a back cover disposed on a rear surface of the display panel, configured to support the display panel, and having a plurality of holes and a seal member disposed to surround a side surface of the display panel, wherein the functional thin-film layer is made of a transparent conducting oxide or an oxide semiconductor, and the inorganic insulating layer comprises a first inorganic insulating layer having an end disposed inward from an end of the sealing substrate.

The display device can further comprise a first bonding layer configured to attach the sealing substrate to the display panel, wherein the first bonding layer surrounds the first inorganic insulating layer and contacts with the functional thin-film layer.

The display device can further comprise an organic insulating layer configured to fill a region between an outer periphery of the first inorganic insulating layer and the seal member, wherein the organic insulating layer contacts with the first bonding layer and the functional thin-film layer.

The organic insulating layer can be made of the same material as the planarization layer.

The display device can further comprise a second inorganic insulating layer separated from the first inorganic insulating layer and also disposed below the seal member.

The display device can further comprise an organic insulating layer disposed to fill a space between the first inorganic insulating layer and the second inorganic insulating layer.

The second inorganic insulating layer can be made of the same material as the first inorganic insulating layer.

The back cover can have a plurality of opening portions disposed only in a central region that overlaps the display panel, and an end of the central region overlaps the sealing substrate.

The end of the central region can overlap the end of the sealing substrate.

The end of the central region can be positioned further inside than the end of the sealing substrate.

The display device can further comprise a flexible film disposed above the back cover and configured to supply a signal to the light-emitting element.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
a lower substrate made of a transparent conducting oxide or an oxide semiconductor;
a first inorganic insulating layer disposed on the lower substrate;
a planarization layer disposed on the first inorganic insulating layer;
a light-emitting element disposed on the planarization layer;
a sealing substrate disposed on the first inorganic insulating layer, the planarization layer, and the light-emitting element;
a back cover disposed on the sealing substrate and having a plurality of opening portions; and
a roller part configured to wind or unwind the back cover,
wherein an end of the first inorganic insulating layer is disposed inward from an end of the sealing substrate,
wherein the back cover comprises:
a first support area;
a ductile area extending from the first support area and having the plurality of opening portions; and
a second support area extending from the ductile area and fastened to the roller part,
wherein a boundary between the ductile area and the second support area overlaps the sealing substrate, and
wherein the boundary between the ductile area and the second support area is positioned further inside than the end of the sealing substrate.

2. The display device of claim 1, further comprising:
a first bonding layer configured to attach the sealing substrate to the lower substrate,
wherein the first bonding layer is disposed to surround the first inorganic insulating layer.

3. The display device of claim 2, wherein the first bonding layer is disposed to contact with the lower substrate in an outer peripheral region of the first inorganic insulating layer.

4. The display device of claim 2, further comprising:
an organic insulating layer disposed to surround an outer peripheral region of the first inorganic insulating layer.

5. The display device of claim 2, further comprising:
a second inorganic insulating layer spaced apart from the first inorganic insulating layer and configured to overlap the end of the sealing substrate.

6. The display device of claim 5, further comprising:
an organic insulating layer disposed to fill a space between the first inorganic insulating layer and the second inorganic insulating layer.

7. The display device of claim 5, wherein the second inorganic insulating layer is made of a same material as the first inorganic insulating layer.

8. The display device of claim 1, wherein an area of the boundary between the ductile area and the second support area overlaps the end of the sealing substrate.

9. The display device of claim 1, further comprising:
a second bonding layer configured to attach the back cover to a display panel,
wherein the second bonding layer is positioned inward from the end of the sealing substrate.

10. The display device of claim 1, further comprising:
a flexible film disposed in the first support area and configured to supply a signal to the light-emitting element.

11. A display device comprising:
a display panel including a functional thin-film layer, an inorganic insulating layer, a planarization layer, a light-emitting element, and a sealing substrate, the display panel being divided into a display area and a non-display area;
a back cover disposed on a rear surface of the display panel, configured to support the display panel, and having a plurality of holes; and
a seal member disposed to surround a side surface of the display panel,
wherein the functional thin-film layer is made of a transparent conducting oxide or an oxide semiconductor,
wherein the inorganic insulating layer includes a first inorganic insulating layer having an end disposed inward from an end of the sealing substrate,
wherein the back cover comprises,
a first support area;
a ductile area extending from the first support area and having a plurality of opening portions; and
a second support area extending from the ductile area and fastened to a roller part,
wherein a boundary between the ductile area and the second support area overlaps the sealing substrate, and
wherein the boundary between the ductile area and the second support area is positioned further inside than the end of the sealing substrate.

12. The display device of claim 11, further comprising:
a first bonding layer configured to attach the sealing substrate to the display panel,
wherein the first bonding layer surrounds the first inorganic insulating layer and is in contact with the functional thin-film layer.

13. The display device of claim 12, further comprising:

an organic insulating layer configured to fill a region between an outer periphery of the first inorganic insulating layer and the seal member, wherein the organic insulating layer is in contact with the first bonding layer and the functional thin-film layer.

14. The display device of claim 13, wherein the organic insulating layer is made of a same material as the planarization layer.

15. The display device of claim 12, further comprising:

a second inorganic insulating layer separated from the first inorganic insulating layer and also disposed below the seal member.

16. The display device of claim 15, further comprising:

an organic insulating layer disposed to fill a space between the first inorganic insulating layer and the second inorganic insulating layer.

17. The display device of claim 15, wherein the second inorganic insulating layer is made of a same material as the first inorganic insulating layer.

18. The display device of claim 11, wherein the back cover has the plurality of opening portions disposed only in a central region that overlaps the display panel, and an end of the central region overlaps the sealing substrate.

19. The display device of claim 18, wherein the end of the central region overlaps the end of the sealing substrate.

20. The display device of claim 18, wherein the end of the central region is positioned further inside than the end of the sealing substrate.

21. The display device of claim 18, further comprising:

a flexible film disposed above the back cover and configured to supply a signal to the light-emitting element.

22. The display device of claim 1, wherein the end of the first inorganic insulating layer is disposed between an end of the planarization layer and the end of the sealing substrate.

* * * * *